United States Patent
Zhang et al.

(10) Patent No.: US 11,024,393 B1
(45) Date of Patent: Jun. 1, 2021

(54) READ OPERATION FOR NON-VOLATILE MEMORY WITH COMPENSATION FOR ADJACENT WORDLINE

(71) Applicant: SanDisk Technologies LLC, Addison, TX (US)

(72) Inventors: Zhiping Zhang, San Jose, CA (US); Huai-Yuan Tseng, San Ramon, CA (US); Ken Oowada, Fujisawa (JP); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/738,677

(22) Filed: Jan. 9, 2020

(51) Int. Cl.
*G11C 16/26* (2006.01)
*G11C 16/04* (2006.01)
*G11C 16/10* (2006.01)
*G11C 16/08* (2006.01)
*G11C 16/24* (2006.01)

(52) U.S. Cl.
CPC .......... *G11C 16/26* (2013.01); *G11C 16/0483* (2013.01); *G11C 16/08* (2013.01); *G11C 16/10* (2013.01); *G11C 16/24* (2013.01)

(58) Field of Classification Search
CPC ......... G11C 16/26; G11C 16/24; G11C 16/10; G11C 16/0483; G11C 16/08
See application file for complete search history.

(56) References Cited

U.S. PATENT DOCUMENTS

| | | | |
|---|---|---|---|
| 5,790,464 A | 8/1998 | Roh et al. |
| 5,793,383 A | 8/1998 | Proebsting |
| 6,144,610 A | 11/2000 | Zheng et al. |
| 7,196,928 B2 | 3/2007 | Chen |
| 7,196,946 B2 | 3/2007 | Chen et al. |
| 7,436,733 B2 | 10/2008 | Mokhlesi |
| 7,499,319 B2 | 3/2009 | Mokhlesi |
| 7,616,505 B2 | 11/2009 | Mui et al. |
| 7,616,506 B2 | 11/2009 | Mui et al. |
| 8,400,839 B2 | 3/2013 | Li |
| 8,498,152 B2 | 7/2013 | Alrod et al. |
| 8,743,638 B2 | 6/2014 | Hung et al. |
| 8,780,667 B2 | 7/2014 | Shibazaki |
| 8,982,641 B2 | 3/2015 | Lu et al. |
| 9,070,472 B2 | 6/2015 | Alrod et al. |
| 9,196,582 B2 | 11/2015 | Hsu |
| 9,336,891 B2 | 5/2016 | Yuan et al. |

(Continued)

*Primary Examiner* — Ajay Ojha
(74) *Attorney, Agent, or Firm* — Vierra Magen Marcus LLP

(57) ABSTRACT

An apparatus comprises a driver circuit, sense circuit, and die controller. The driver circuit supplies a pass voltage to a selected word line and unselected word lines, a sense voltage to an adjacent word line, and a bit line voltage to bit lines coupled to selected and unselected word lines. The sense circuit determines nonconducting and conducting memory cells on the adjacent word line. The die controller then directs the driver circuit to ramp the sense voltage on the adjacent word line to the pass voltage and ramp the pass voltage on the selected word line to ground. The die controller then directs the driver circuit to ramp the bit line voltage for bit lines coupled to nonconducting memory cells to a bit line compensation voltage and directs the sense circuit to read memory cells of the selected word line based on the bit line compensation voltage.

20 Claims, 9 Drawing Sheets

(56) References Cited

U.S. PATENT DOCUMENTS

| | | |
|---|---|---|
| 9,343,164 B2 | 5/2016 | Tseng et al. |
| 9,548,129 B2 | 1/2017 | Paudel et al. |
| 9,691,438 B2 | 6/2017 | Lee |
| 9,721,652 B2 * | 8/2017 | Puthenthermadam ........................ G11C 16/3427 |
| 9,805,809 B1 * | 10/2017 | Zhou .................. G11C 16/0466 |
| 9,865,352 B2 | 1/2018 | Miao et al. |
| 2014/0269086 A1 | 9/2014 | Lasser |

* cited by examiner

READ OPERATION FOR NON-VOLATILE MEMORY WITH COMPENSATION FOR ADJACENT WORDLINE

BACKGROUND

An adjacent word line read is a method of checking a memory state on a neighbor word line to the word line about to be read (an adjacent word line and a selected word line, respectively) in order to facilitate reading of the selected word line. Typically, the neighbor word line checking is a word line that was programmed after the word line that is about to be read. The programming of the adjacent word line may disturb the memory state of memory cells on the word line being read. The degree of disturb is influenced by the state that the memory cells of the adjacent word line are programmed to.

Based on a memory state of the memory cells of the adjacent word line, the selected word line may be read more accurately by applying a different voltage on the adjacent word line during the read operation.

As memory devices near end of life, and/or data is retained for long periods of time without being accessed and refreshed, lateral charge loss may cause a data value stored in a memory cell to deteriorate. In particular, when an adjacent word line is programmed following programming of a selected word line. Programming of the adjacent word line may disturb the threshold voltage of the memory cells of the selected word line.

Without a compensation for this disturb, the memory cells of the selected word line may read out an incorrect memory state. Adjusting the read operation, based on the state of a memory cell in the adjacent word line may compensate for the disturb and enable accurate reading of memory cells in the word line.

The conventional adjacent word line read process incurs a timing impact (increased latency), however. As processors increase in speed, memory/storage latency becomes more and more of a factor. Therefore, there is a need for a more efficient and faster adjacent word line read method to improve read accuracy with reduced latency.

BRIEF SUMMARY

This disclosure relates to an apparatus comprising a memory array, a die controller, driver circuit, and a sense circuit. The memory array may comprise bit lines coupled to NAND strings having memory cells coupled to word lines. The die controller may be configured to direct a sense circuit to sense a set of nonconducting memory cells and a set of conducting memory cells on an adjacent word line based on a sense voltage.

The driver circuit configured to supply a bit line voltage to bit lines of the set of conducting memory cells and concurrently supply a bit line compensation voltage to bit lines of the set of nonconducting memory cells. The die controller may be configured to direct the sense circuit to read memory cells of a selected word line concurrent with the driver circuit supplying the bit line voltage and the bit line compensation voltage.

This disclosure further relates to a system comprising a three-dimensional memory array, a driver circuit, a sense circuit, and a die controller. The three-dimensional memory array may be coupled to bit lines and word lines.

The word lines may comprise a selected word line, an adjacent word line, and unselected word lines. The driver circuit may be coupled to the word lines and the bit lines. The driver circuit may be configured to supply different voltage biases to the word lines and the bit lines. The sense circuit may be coupled to the bit lines and may be configured to sense conducting memory cells and nonconducting memory cells of the word lines of the three-dimensional memory array.

The die controller may be coupled to the driver circuit and may be configured to direct the driver circuit to bias the bit lines and the word lines. The die controller may direct the sense circuit to sense the conducting memory cells and the nonconducting memory cells of the adjacent word line. The die controller may organize the conducting memory cells into a first zone and the nonconducting memory cells into a second zone. The die controller may direct the driver circuit to bias the selected word line to a first read voltage, then direct the sense circuit to sense memory cells of the first and second zones while the selected word line is biased to the first read voltage.

The die controller may further direct the driver circuit to bias the selected word line to a second read voltage, then direct the sense circuit to sense memory cells of the first and second zones while the selected word line is biased to the second read voltage. Finally, the die controller may determine a memory state for the memory cells of the selected word line based on sensed memory cells of the first zone and sensed memory cells of the second zone.

Finally, this disclosure relates to a method for reading memory cells. During an initialization phase, a pass voltage is supplied to unselected word lines and to a selected word line of a memory array, a bit line voltage to bit lines of the memory array, and a sense voltage is supplied to an adjacent word line of the memory array. During a zoning phase, the adjacent word line is sensed for a set of nonconducting memory cells of the adjacent word line in response to the supplied sense voltage.

During a transition phase, the sense voltage is ramped up to the pass voltage on the adjacent word line, and the pass voltage is discharged on the selected word line in response to sensing the adjacent word line. During a reading phase, the bit line voltage on bit lines coupled to the nonconducting memory cells is ramped to a bit line compensation voltage, and memory cells of the selected word line are read at a read voltage.

"Ramp" refers to the act of biasing a structure from an initial voltage level to a target voltage level. Typically, the initial voltage level is low, such ground or nearly zero volts, and the target voltage level is higher than the initial voltage level. In such instances, the term 'ramp' may be used together with the term 'up' to indicate this relationship. However, ramp may be used herein to describe an act of biasing, or driving, or discharging a structure from an initial voltage level to a target voltage level where the target voltage level is less than an initial voltage level. In such instances, the term 'ramp' may be used alone.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
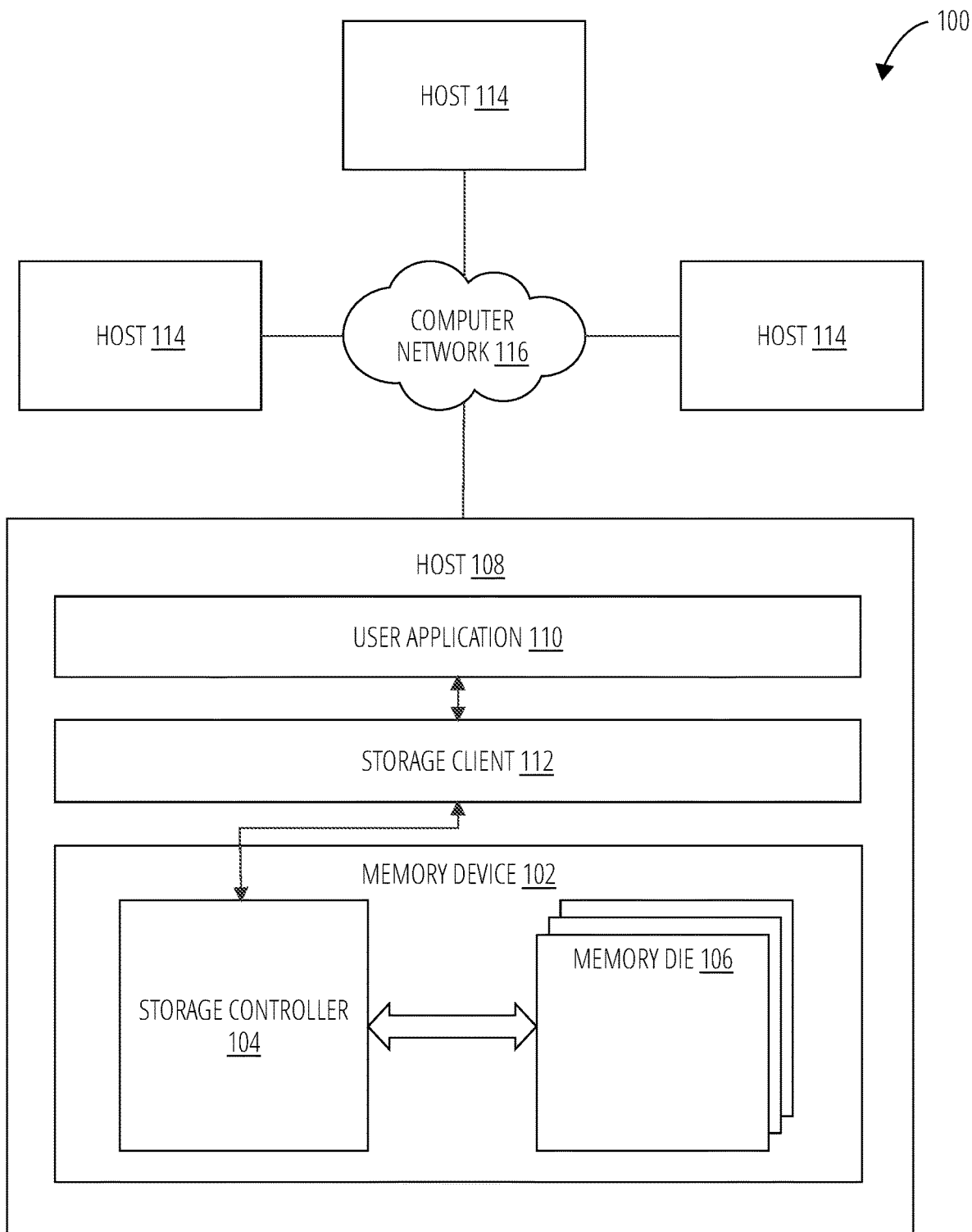
FIG. 1 illustrates a system 100 in accordance with one embodiment.

This disclosure relates to an improved adjacent word line read operation. This method may be used to account for program disturb when a neighbor word line is programmed. Embodiments of this solution may apply a different bit line compensation voltage on bit lines of a selected word line during a read operation based on programming state settings of memory cells in the adjacent word line (the later programmed word line). This method may be utilized for single- and multi-level memory cells, including 3-level and 4-level memory cells.

"Word line" refers to a structure within a memory array comprising a set of memory cells. The memory array is configured such that the operational memory cells of the word line are read or sensed during a read operation. Similarly, the memory array is configured such that the operational memory cells of the word line are programmed, or written to, during a write/program operation.

Word lines, in some embodiments, comprise the rows of a memory array, storage block, erase block, or the like. Each word line, in some embodiments, connects to control gates of each memory cell in a row. Alternatively, the control gates may be provided by the word lines themselves. In some embodiments, a word line may include tens, hundreds, thousands, or millions of memory cells.

"Adjacent word line" refers to a word line physically positioned within a memory array structure such that the word line is adjacent to a selected word line. In certain embodiments, word lines of a memory array are programmed in sequential order from a first word line, e.g., WL 0 up to a last word line, e.g., WL X. In such an embodiment, any word line of the memory array may be the selected word line, referred to herein as WLn, and the next, or subsequent, word line to be programmed in the memory array is the adjacent word line, referred to herein as WLn+1, because it is the next word line programmed in the memory array.

During programming of an adjacent word line, a coupling effect, or disturb, may cause a shift in the charge stored in memory cells of the selected word line, depending on the state programmed to the memory cells in the adjacent word line. This coupling effect may cause memory cells of the selected word line to be read, or sensed, incorrectly. Consequently, a compensation may be applied when reading memory cells of the selected word line to account for a coupling effect.

"Coupling effect" refers to a change to a state of a programmed memory cell from an original programmed state to a state other than the target state used when the memory cell is programmed. Coupling effect refers to any influence, disturb, or change to a memory cell state caused by other storage operations performed on a memory array. Coupling effect may also be referred to as a disturb, such as a programming disturb or a read disturb.

Generally, a die controller performs a programming storage operation on a memory cell. As the die controller performs other storage operations on other memory cells a coupling effect may cause undesirable changes to the programming state (aka memory state) of the memory cell.

"Storage operation" refers to an operation performed on a memory cell to change the value of data represented by a state characteristic of the memory cell. In certain embodiments, a storage operation may include a series of steps that are performed in sequential order to complete the storage operation. Examples of storage operations, include but are not limited to reading data from a memory cell, writing (or programming) data to a memory cell, and/or erasing data stored in a memory cell.

"Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation cause the attribute to change to a target level with a single iteration.

Compared to a conventional adjacent word line read operation, which may take approximately 2.7 times a normal read time, the improved read method proposed herein may take 1 to 1.5 times the normal read time. This time saving may be gained at least in part by eliminating a read voltage and/or a pass voltage spike step, eliminating a channel clean reset step (also referred to as a word line reset), and applying different bit line compensation voltages concurrently.

As an alternative to a concurrent bit line compensation voltage approach, in one embodiment, an FSENSE signal (a signal that registers a memory cell sense operation) applied twice and for different durations may be used to generate two different voltage threshold reads for two or more groupings of memory cells. The read time (sense duration) using this embodiment may be slightly longer than that of applying two different bit line compensation voltages, and this embodiment may be readily designed, without impacting the sense amp area.

FIG. 1 is a schematic block diagram illustrating one embodiment of a system 100 for improving performance in a solid-state storage device in accordance with the claimed solution(s). The system 100 includes a memory device 102, a host 108, one or more hosts 114, and a computer network 116, which are described below.

The system 100 includes at least one memory device 102, comprising a storage controller 104 and one or more memory die 106. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small amount of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search "die (integrated circuit)" Wikipedia.org Oct. 9, 2019. Accessed Nov. 18, 2019; Edited.)

In some embodiments, the system 100 may include two or more memory devices. Each memory device 102 may include one or more memory die 106, such as flash memory, nano random access memory ("nano RAM or NRAM"), magneto-resistive RAM ("MRAM"), dynamic RAM ("DRAM"), phase change RAM ("PRAM"), etc. In further embodiments, the data memory device 102 may include other types of non-volatile and/or volatile data storage, such as dynamic RAM ("DRAM"), static RAM ("SRAM"), magnetic data storage, optical data storage, and/or other data storage technologies. The memory device 102 is described in more detail with respect to FIG. 2.

The memory device 102, also referred to herein as a storage device, may be a component within a host 108 as depicted in here, and may be connected using a system bus, such as a peripheral component interconnect express ("PCIe") bus, a Serial Advanced Technology Attachment ("serial ATA") bus, or the like. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like. In another embodiment, the memory device 102 is external to the host 108 and is connected, a universal serial bus ("USB") connection, an Institute of Electrical and Electronics Engineers ("IEEE") 1394 bus ("FireWire"), or the like. In other embodiments, the memory device 102 is connected to the host 108 using a peripheral component interconnect ("PCI") express bus using external electrical or optical bus extension or bus networking solution such as Infiniband or PCI Express Advanced Switching ("PCIe-AS"), or the like.

In various embodiments, the memory device 102 may be in the form of a dual-inline memory module ("DIMM"), a daughter card, or a micro-module. In another embodiment, the memory device 102 is a component within a rack-mounted blade. In another embodiment, the memory device 102 is contained within a package that is integrated directly onto a higher level assembly (e.g. mother board, lap top, graphics processor). In another embodiment, individual components comprising the memory device 102 are integrated directly onto a higher level assembly without intermediate packaging.

In a further embodiment, instead of being connected directly to the host 108 as DAS, the data memory device 102 may be connected to the host 108 over a data network. For example, the data memory device 102 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 108 and the data memory device 102.

The system 100 includes at least one host 108 connected to the memory device 102. Multiple hosts may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 108 may be a client and the memory device 102 operates autonomously to service data requests sent from the host 108. In this embodiment, the host 108 and memory device 102 may be connected using a computer network, system bus, Direct Attached Storage (DAS) or other communication means suitable for connection between a computer and an autonomous memory device 102.

The depicted embodiment shows a user application 110 in communication with a storage client 112 as part of the host 108. In one embodiment, the user application 110 is a software application operating on or in conjunction with the storage client 112. The storage client 112 manages files and data and utilizes the functions and features of the storage controller 104 and associated memory die 106. Representative examples of storage clients include, but are not limited to, a server, a file system, an operating system, a database management system ("DBMS"), a volume manager, and the like. The storage client 112 is in communication with the storage controller 104 within the memory device 102.

In one embodiment, the system 100 includes one or more clients connected to one or more host 108 through one or more computer networks. A host 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking the host 108 or host devices and host 114 or clients. In one embodiment, the system 100 includes multiple hosts that communicate as peers over a computer network 116. In another embodiment, the system 100 includes multiple memory devices 102 that communicate as peers over a computer network 116. One of skill in the art will recognize other computer networks comprising one or more computer networks and related equipment with single or redundant connection between one or more clients or other computer with one or more memory devices 102 or one or more memory devices 102 connected to one or more hosts. In one embodiment, the system 100 includes two or more memory devices 102 connected through the computer network 116 to a host 114 without a host 108.

In one embodiment, the storage client 112 communicates with the storage controller 104 through a host device interface comprising an Input/Output (I/O) interface. For example, the memory device 102 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write-once storage media, such as solid-state storage memory cells within the memory die 106. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

The memory die 106 may be partitioned into memory divisions that can be erased as a group (e.g., erase blocks) in sequential order to, inter alia, account for the asymmetric properties of the memory die 106 or the like. As such, modifying a single data segment in-place may require erasing the entire erase block comprising the data, and rewriting the modified data to the erase block, along with the original, unchanged data. This may result in inefficient "write amplification," which may excessively wear the memory die 106. Therefore, in some embodiments, the storage controller 104 may be configured to write data out-of-place.

As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices do not directly or necessarily associate logical addresses with particular physical data blocks. These storage devices may emulate a conventional block storage interface to maintain compatibility with a block storage client 112.

In one embodiment, the storage controller 104 provides a block I/O emulation layer, which serves as a block device interface, or API. In this embodiment, the storage client 112 communicates with the storage device through this block device interface. In one embodiment, the block I/O emulation layer receives commands and logical addresses from the storage client 112 in accordance with this block device interface. As a result, the block I/O emulation layer provides the storage device compatibility with a block storage client 112.

In one embodiment, a storage client 112 communicates with the storage controller 104 through a host device interface comprising a direct interface. In this embodiment, the storage device directly exchanges information specific to non-volatile storage devices. A storage device using direct interface may store data in the memory die 106 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 106.

The storage controller 104 receives a logical address and a command from the storage client 112 and performs the corresponding operation in relation to the memory die 106. The storage controller 104 may support block I/O emulation, a direct interface, or both.

Figure 2:
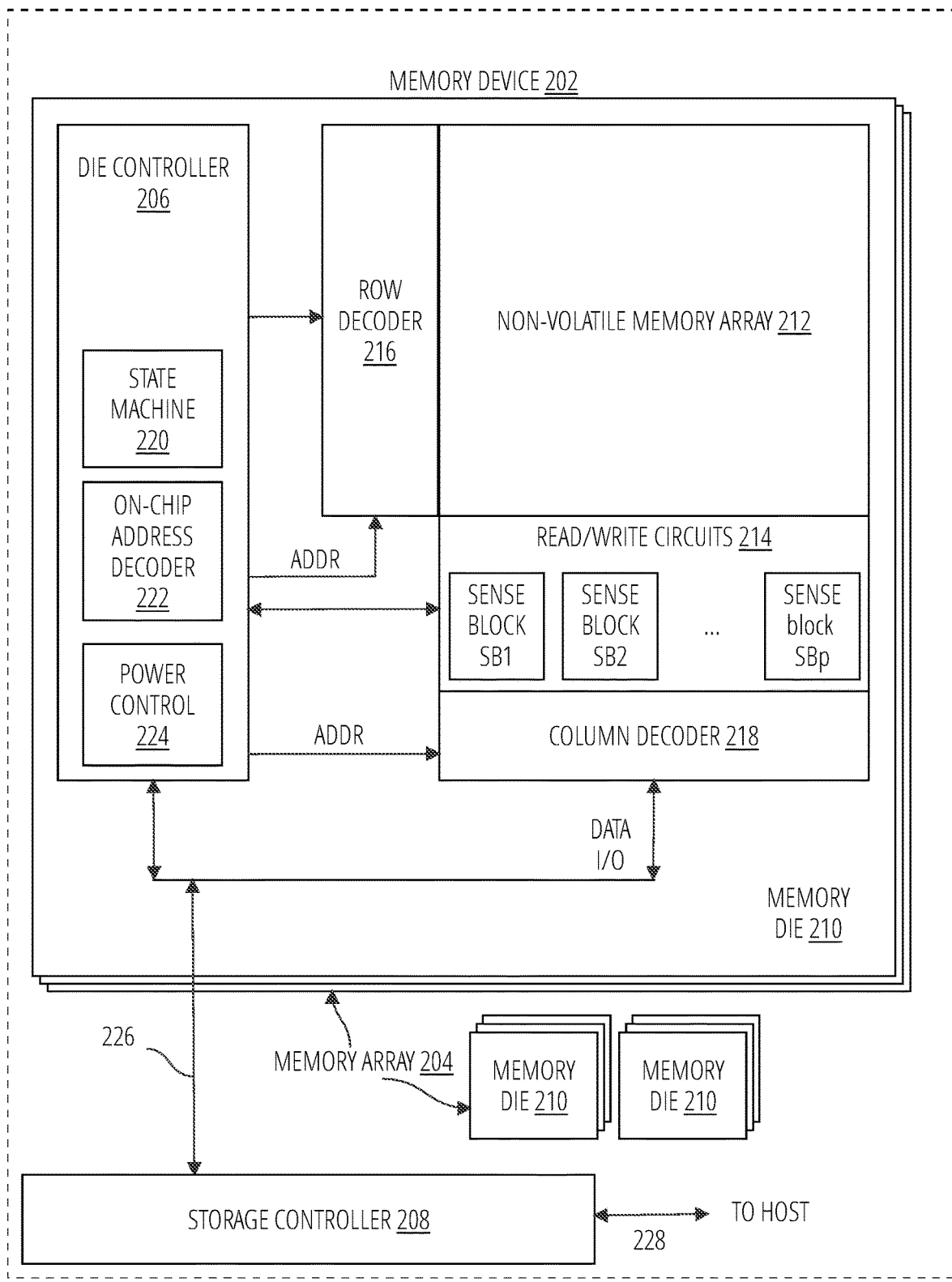
FIG. 2 is a block diagram of an example memory device 202 in one embodiment.

FIG. 2 is a block diagram of an exemplary memory device 202. The memory device 202 may include a storage controller 208 and a memory array 204. The each memory die 210 may include a die controller 206 and at least one non-volatile memory array 212 in the form of a three-dimensional memory array, and read/write circuits 214.

"Non-volatile memory media" refers to any hardware, device, component, element, or circuit configured to maintain an alterable physical characteristic used to represent a binary value of zero or one after a primary power source is removed. "Non-volatile memory" refers to a shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Memory array" refers to a set of memory cells (also referred to as storage cells) organized into an array structure having rows and columns. Consequently, a non-volatile memory array is a memory array having memory cells configured such that a characteristic (e.g. threshold voltage level, resistance level, conductivity, etc.) of the memory cell used to represent stored data remains a property of the memory cell without a requirement for a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

"Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead, and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g. source) at the wafer surface and the other end (e.g. drain) on top.

The non-volatile memory array 212 is addressable by word line via a row decoder 216 and by bit line via a column decoder 218. "Bit line" refers to a circuit structure configured to deliver a voltage and/or conduct current to a column of a memory array. In one embodiment, the column comprises a NAND string, also referred to as channel. In one embodiment, a bit line connects to a NAND string at a drain end of the NAND string. A memory array may have one bit line for each memory cell along the word lines of the memory array.

The read/write circuits 214 include multiple sense blocks SB1, SB2, . . . , SBp (sensing circuitry) and allow a page of memory cells to be read or programmed in parallel. In certain embodiments, a sense block comprises a sense circuit. In certain embodiments, each memory cell across a row of the memory array together form a physical page.

A physical page may include memory cells along a row of the memory array for a single plane or for a single memory die. In one embodiment, the memory die includes a memory array made up of two equal sized planes. "Plane" refers to a division of a memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 108 and storage controller 208 via a data bus 228, and between the storage controller 208 and the one or more memory die 210 via bus 226.

The non-volatile memory array 212 can be two-dimensional (2D—laid out in a single fabrication plane) or three-dimensional (3D—laid out in multiple fabrication planes). The non-volatile memory array 212 may comprise one or more arrays of memory cells including a 3D array. In one embodiment, the non-volatile memory array 212 may comprise a monolithic three-dimensional memory structure (3D array) in which multiple memory levels are formed above (and not in) a single substrate, such as a wafer, with no intervening substrates. The non-volatile memory array 212 may comprise any type of non-volatile memory that is monolithically formed in one or more physical levels of arrays of memory cells having an active area disposed above a silicon substrate. The non-volatile memory array 212 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), circuitry forming a communications device (e.g., a modem, communications switch, or optical-electrical equipment), and the like.

The die controller 206 cooperates with the read/write circuits 214 to perform memory operations (e.g., storage operations) on memory cells of the non-volatile memory array 212, and includes a state machine 220, an address decoder 222, and a power control 224. The state machine 220 provides chip-level control of memory operations.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 222 provides an address interface between an address used by the host or a storage controller 208 to the hardware address used by the row decoder 216 and column decoder 218. The power control 224 controls the power and voltages supplied to the various control lines during memory operations. The power control 224 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 224 may detect a sudden loss of power and take precautionary actions. The power control 224 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 212, can be thought of as at least one control circuit or storage controller which is configured to perform the techniques described herein. For example, a control circuit may include any one of, or a combination of, die controller 206, state machine 220, address decoder 222, column decoder 218, power control 224, sense blocks SB1, SB2, . . . , SBp, read/write circuits 214, storage controller 208, and so forth.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the storage controller 208 to perform the methods described herein. The host may also include additional system memory, one or more input/output interfaces and/or one or more input/output devices in communication with the one or more processors, as well as other components well known in the art.

Associated circuitry is typically required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
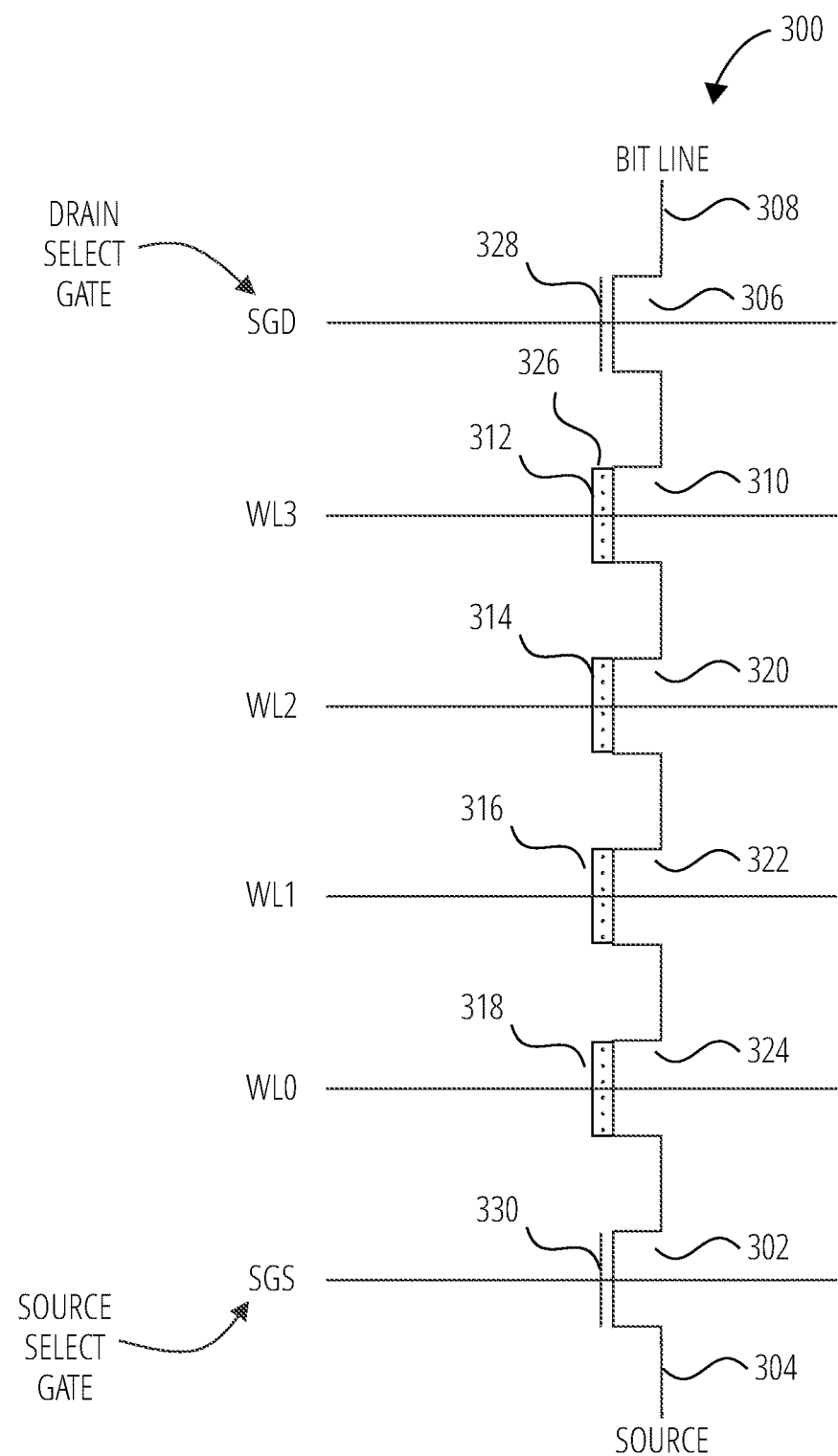
FIG. 3 is a schematic block diagram illustrating one embodiment of a NAND string 300.

FIG. 3 depicts one embodiment of a NAND string 300 comprising a plurality of memory cells. A NAND string 300 comprises a series of memory cells (e.g., n=4, 8, 16 or higher) daisy-chained by their sources and drains. A pair of select transistors connect the memory transistor chain's to a bias by way of the NAND string's drain terminal and to a ground source by way of a source terminal. In a memory array, when the select transistor 302 is turned on, the source terminal is coupled to a source line 304. Similarly, when the select transistor 306 is turned on, the drain terminal of the NAND string is coupled to a bit line 308 of the memory array.

Each memory cell in the chain may comprise a transistor. The memory cell has a charge storage element to store a given amount of charge so as to represent an intended memory state. "Memory state" refers to a condition of a memory cell designed and/or configured to represent an encoding for one or more data bit values. In certain embodiments, the memory state may be changed by using a storage operation. In a non-volatile memory cell the memory cell maintains its memory state without a power source.

A control gate of each memory transistor allows control over read and write operations. The control gates of corresponding memory transistors of a row of memory array (one from each NAND string) are all connected to the same word line. Similarly, a control gate of each of the select transistors provides controlled access to the NAND string via its source terminal and drain terminal respectively.

When an addressed memory cell (e.g., transistor 310) within a NAND string is read or is verified during programming, its control gate (e.g., control gate 312) is supplied with an appropriate voltage, also referred to as a reference voltage or read voltage. At the same time, the rest of the non-addressed memory cells in the NAND string 300 are fully turned on by application of sufficient voltage (also referred to as a pass voltage) on their control gates (e.g., control gate 314, control gate 316, and control gate 318 in FIG. 3). In this way, a conductive path is effectively created from the source of the individual memory cell to the source terminal (e.g., source line 304) of the NAND string 300 and likewise for the drain of the individual memory cell to the drain terminal (e.g., bit line 308) of the memory cell. This conductive path may travel through one or more structures of a NAND string and is referred to herein as channel.

"Read voltage" refers to a voltage level configured to test, or check, which memory cells conduct at the voltage level. In certain embodiments, depending on the type of encoding used to store data on the memory cell and the number of bits encoded on each memory cell, a single read/sense operation using a single read voltage may be determinative of the memory state of the memory cell. In other embodiments, a number of read/sense operations each performed at different read voltage may be used to determine the memory state of the memory cell. The determined memory state may then be decoded into a representation of the data bits stored by the memory cell.

Said another way, one or more read voltages are used to determine a memory state for a memory cell and the memory state is representative of one or more data values for data bits stored/encoded in the memory cell.

In certain embodiments, a read voltage may be referred to as a reference voltage. Accordingly, in certain examples and/or embodiments, different read voltages may be represented by an abbreviation and a number. For example, two read voltages may be referred to as Control Gate Voltage 1 (VCG1) or VCG2, etc.

In other embodiments, where each memory state may be associated with an abbreviation such as ER for the erased memory state, A for a next highest range of voltages memory state, B for a next highest range of voltages memory state, C for a next highest range of voltages memory state, D for a next highest range of voltages memory state, E for a next highest range of voltages memory state, F for a next highest range of voltages memory state, and G for a next highest range of voltages memory state. In such embodiments, the read voltage may comprise a voltage level that marks the lower voltage defining the memory state and may be referred to using an abbreviation that includes the letter abbreviation. For example VrA, VrB, VrC, VrD, VrE, VrF, and VrG may be used.

"Pass voltage" refers to a voltage level configured to activate (cause to conduct) memory cells regardless of the memory state stored/retained on the memory cell. A pass voltage is set to a high enough voltage that memory cells having a high threshold voltage (e.g., greater than 6 volts) will activate/conduct when the pass voltage is supplied to a gate of the memory cell implemented as a transistor.

In certain embodiments, the purpose of a pass voltage, is to create a conduction path between a sense amplifier connected to a bit line at one end of a NAND string (also referred to a as a channel) that includes the memory cell and a source line connected at the other end of the NAND string. The conduction path may be desired so that a memory cell along the NAND string coupled to a selected word line can be read, sensed, or programmed. In one embodiment, a pass voltage is provided to unselected word lines so that a storage operation can be performed on memory cells of a selected word line. In certain embodiments, a pass voltage is not used to read a memory state of a memory cell.

The example NAND string 300 depicted in FIG. 3, in some embodiments, includes four transistors (transistor 310, transistor 320, transistor 322, and transistor 324) connected in series and located between a first select transistor 306 and a second select transistor 302. In some embodiments, the transistor 310, transistor 320, transistor 322, and transistor 324 each include a control gate with a charge trap layer 326. Control gate 312, control gate 314, control gate 316, and control gate 318, in one embodiment, are connected to, or comprise a portion of, a word line. In a further embodiment, transistor 310, transistor 320, transistor 322, and transistor 324 are memory cells, storage elements, or the like, also referred to herein as memory cells. In some embodiments, a single memory cell may include multiple transistors.

The first select transistor 306, in some embodiments, gates/connects the NAND string 300 to a bit line 308 via a drain select gate/select gate drain (SGD). The second select transistor 302, in certain embodiments, gates/connects the NAND string 300 to a source line 304 via a source select gate/select gate source (SGS). The first select transistor 306, in a further embodiment, is controlled by applying a voltage to a corresponding select gate 328. The second select transistor 302, in some embodiments, is controlled by applying a voltage to corresponding select gate 330.

As shown in FIG. 3, the source line 304, in one embodiment, is connected to the source lead of each transistor/memory cell in the NAND string 300. The NAND string 300, in some embodiments, may include some memory cells that have been programmed and some memory cells that have not been programmed.

Figure 4:
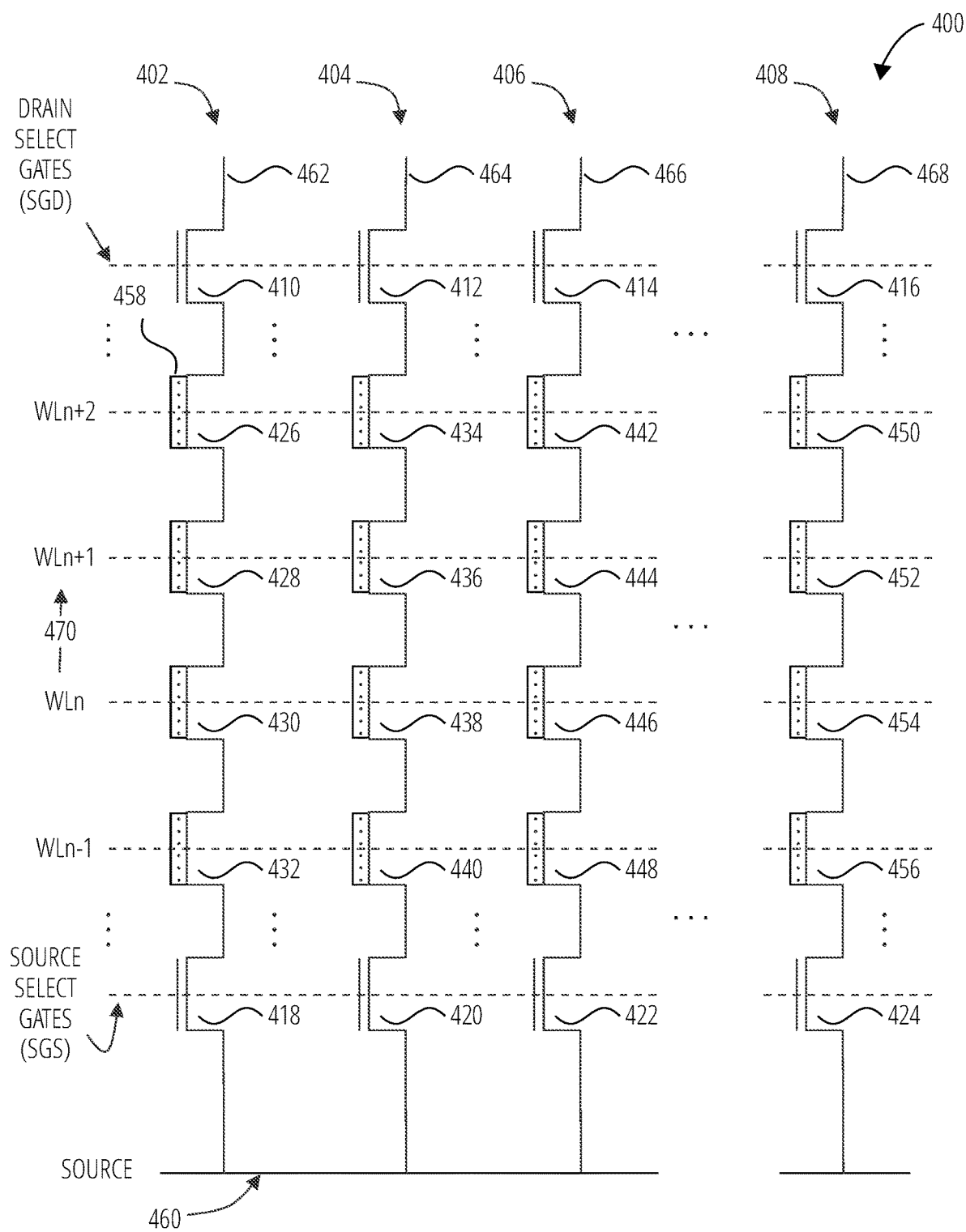
FIG. 4 is a schematic block diagram illustrating one embodiment of a three-dimensional memory array 400.

FIG. 4 is a circuit diagram depicting a three-dimensional memory array 400 comprising a plurality of NAND strings. An architecture for a memory array using a NAND structure may include a significant number of NAND strings. For example, FIG. 4 illustrates a three-dimensional memory array 400 that includes NAND string 402, NAND string 404, NAND string 406, and NAND string 408. In the depicted embodiment, each NAND string includes drain select transistors (select transistor 410, select transistor 412, select transistor 414, and select transistor 416), source select transistors (select transistor 418, select transistor 420, select transistor 422, select transistor 424), and memory cells (memory cell 426, memory cell 428, memory cell 430, memory cell 432, memory cell 434, memory cell 436, memory cell 438, memory cell 440, memory cell 442, memory cell 444, memory cell 446, memory cell 448, memory cell 450, memory cell 452, memory cell 454, memory cell 456). The memory cells may be transistors that incorporate a charge trap layer 458. While four memory cells per NAND string are illustrated for simplicity, some NAND strings can include any number of memory cells, e.g., thirty-two, sixty-four, or the like memory cells.

NAND string 402, NAND string 404, NAND string 406, and NAND string 408, in one embodiment, are connected to a source line 460 by source select transistor 418, select transistor 420, select transistor 422, and select transistor 424, respectively. A source select line SGS may be used to control the source side select transistors, (e.g., select transistor 418, select transistor 420, select transistor 422, select transistor 424). The various NAND strings, in one embodiment, are connected to bit line 462, bit line 464, bit line 466, and bit line 468 by drain select transistor 410, select transistor 412, select transistor 414, and select transistor 416, respectively, as shown. The drain select transistors may be controlled by a drain select line SGD. In some embodiments, the select lines do not necessarily need to be in common among the NAND strings; that is, different select lines can be provided for different NAND strings.

As described above, each word line WL0-WLp, where WLp is the word line closest to the drain select gates, comprises one or more memory cells. In the depicted embodiment, each of bit line 462, bit line 464, bit line 466, and bit line 468, and the respective NAND string 402, NAND string 404, NAND string 406, and NAND string 408, comprise the columns of the three-dimensional memory array 400, storage block, erase block, or the like. These columns may also be referred to as channels. The word lines WL0-WLn, in some embodiments, comprise the rows of the three-dimensional memory array 400, storage block, erase block, or the like. Each word line WL0-WLp, in some embodiments, connects the control gates of each memory cell in a row. Alternatively, the control gates may be provided by the word lines WL0-WLp themselves. In some embodiments, a word line WL0-WLp may include tens, hundreds, thousands, millions, or the like of memory cells.

"Sequence" refers to a predetermined sequential order in which an operation or steps of an operation are to be performed. In a memory array, word lines may be organized or architected to facilitate use in a sequential order so that the memory array is used efficiently. The same, or different sequences, may be used for any of the storage operations.

For example, in one embodiment, the word lines of a memory array may be programmed in sequential order starting from a word line closest to a source line and progressing sequentially with each adjacent unprogrammed word line toward a word line closest to a select gate drain and/or bit line. In another example, in one embodiment, the word lines of a memory array may be programmed in sequential order starting from a word line closest to a select gate drain and/or bit line and progressing sequentially with each adjacent unprogrammed word line toward a word line closest to a source line and/or source select gate. In still other examples, a sequence for choosing which word line to program after a last programmed word line may follow a pattern other than sequential.

"Sequential order" refers to a set of steps, operations, sub-steps, or events that are arranged to be done in a certain sequence.

The word lines may in this disclosure be accessed (e.g., programmed) in a word line sequential order 470. One sequence of word lines, according to one embodiment, is indicated by the arrow word line sequential order 470. When word lines are programmed in word line sequential order 470, the word lines are programmed in sequence, one after the other, starting from one end of the NAND strings. When a storage operation is directed at a single word line, that word line is referred to herein as a selected word line.

"Selected word line" refers to a word line designated for use in a particular storage operation or memory operation. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

Other word lines that are not a focus of a storage operation are referred to as unselected word lines. "Unselected word line" refers to a set of word lines that are not designated for use in a particular storage operation or memory operation. This means that performing the storage operation is not intended to change the memory state of memory cells of the unselected word lines. Changes to memory state of memory cells of the unselected word lines is inadvertent and may be considered a disturb or unintended consequence.

While memory cells of unselected word lines are not intended to change memory state because of the storage operation, performance of the storage operation may still require applying certain biases, or voltages to the word lines of unselected word lines and/or may include certain biases or voltages applied to bit lines that connect to the NAND strings of channels that include the unselected word lines. In certain embodiments, biases applied to unselected word lines are applied to all unselected word lines simultaneously, still other unselected word lines may receive a different bias than that applied to a first set of unselected word lines in order to satisfactorily conduct the storage operation.

A word line selected for a read operation (the selected word line or WLn) and the unselected word lines (WLn−1, WLn+1, and WLn+2) may be organized in this word line sequential order 470, from n=0 to n=p, and the die controller may be configured to program each word line of the three-dimensional memory array in this sequential order such that the adjacent word line (WLn+1) is programmed after the selected word line (WLn).

In one embodiment, each memory cell is configured to store data. For example, when storing one bit of digital data, the range of possible threshold voltages ("VTH") of each memory cell may be divided into two ranges which are assigned logical data "1" and "0." As used herein, threshold voltage refers to a magnitude of voltage applied to the gate of a memory cell sufficient to cause the memory cell to activate. In embodiments, in which the memory cell is a NAND transistor, the threshold voltage is a sufficient voltage applied to a gate terminal of the transistor that causes the transistor to conduct current between its source terminal and drain terminal. In one example of a NAND type flash memory, the VTH may be negative after the memory cells are erased and defined as logic "1." In one embodiment, the VTH after a program operation is positive and defined as logic "0."

When the VTH is negative and a read is attempted, in some embodiments, memory cells will turn on to indicate logic "1" is being stored. When the VTH is positive and a read operation is attempted, in a further embodiment, a memory cell will not turn on, which indicates that logic "0" is stored. Each memory cell may also store multiple levels of information, for example, multiple bits of digital data. In such an embodiment, the range of VTH value is divided into the number of levels of data. For example, if four levels of information can be stored in each memory cell, there will be four VTH ranges assigned to the data values "11", "10" "01", and "00."

In one example of a NAND type memory, the VTH after an erase operation may be negative and defined as "11." Positive VTH values may be used for the states of "10", "01", and "00." In one embodiment, the specific relationship between the data programmed into the memory cells and the threshold voltage ranges of the memory cells depends upon the data encoding scheme adopted for the memory cells.

The apparatus disclosed herein may be coupled to a three-dimensional memory array of memory cells that may comprise a selected word line and unselected word lines embodied by circuitry. A selected word line may be the WLn shown. The unselected word lines may be organized, with the selected word line in a sequence, such as WLn−1 through WLn+2. A die controller, such as the one illustrated in FIG. 7, may be configured to program each word line of the three-dimensional memory array in a sequential order (e.g., word line sequential order 470) such that the adjacent word line (e.g., WLn+1) is programmed after the selected word line (e.g., WLn).

Figure 7:
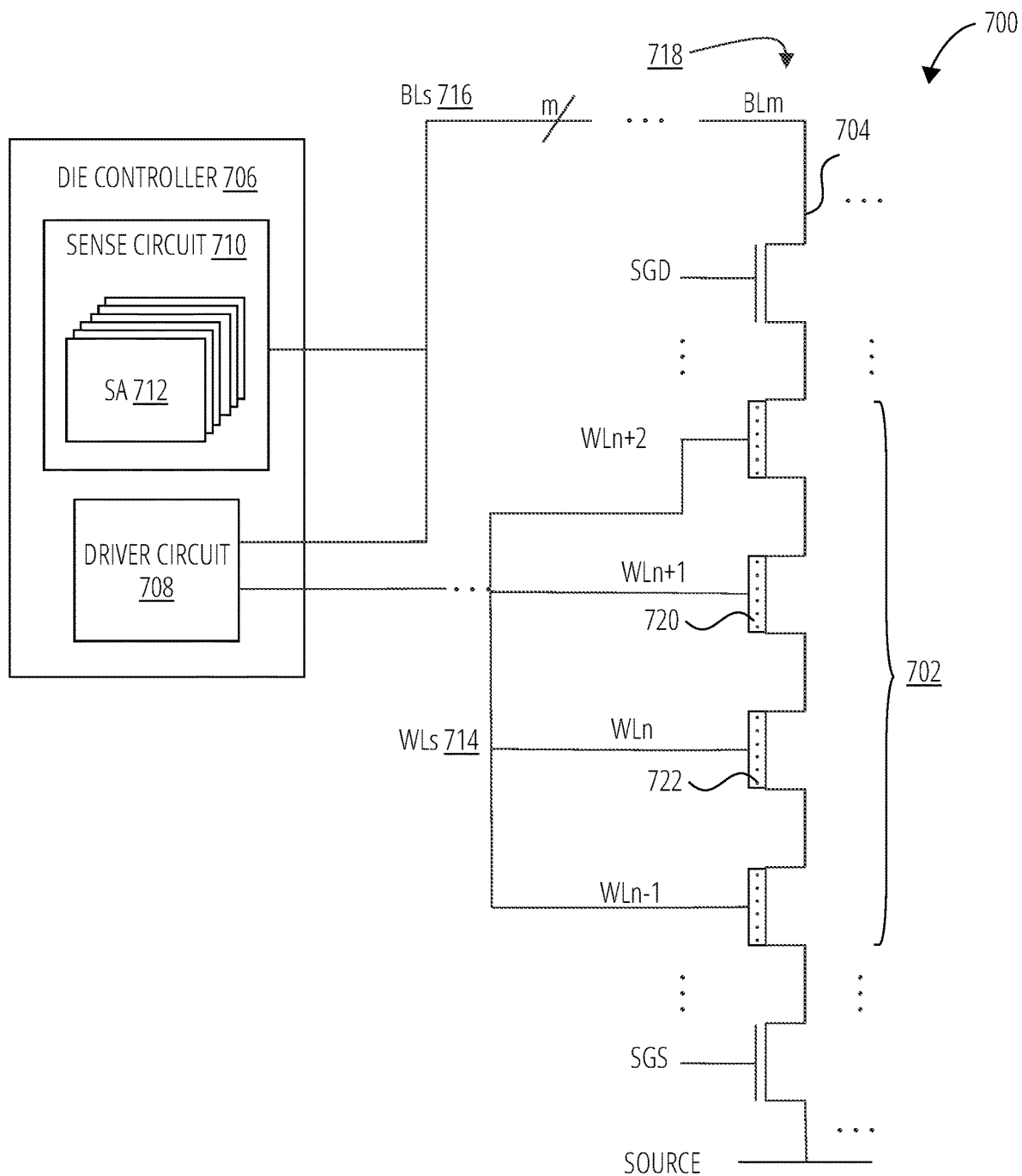
FIG. 7 illustrates a memory array with die controller 700 in accordance with one embodiment.

The three-dimensional memory array 400 may comprise NAND strings of memory cells, each memory cell coupled to a word line and each NAND string coupled to a bit line, as illustrated here and in FIG. 7.

Figure 5:
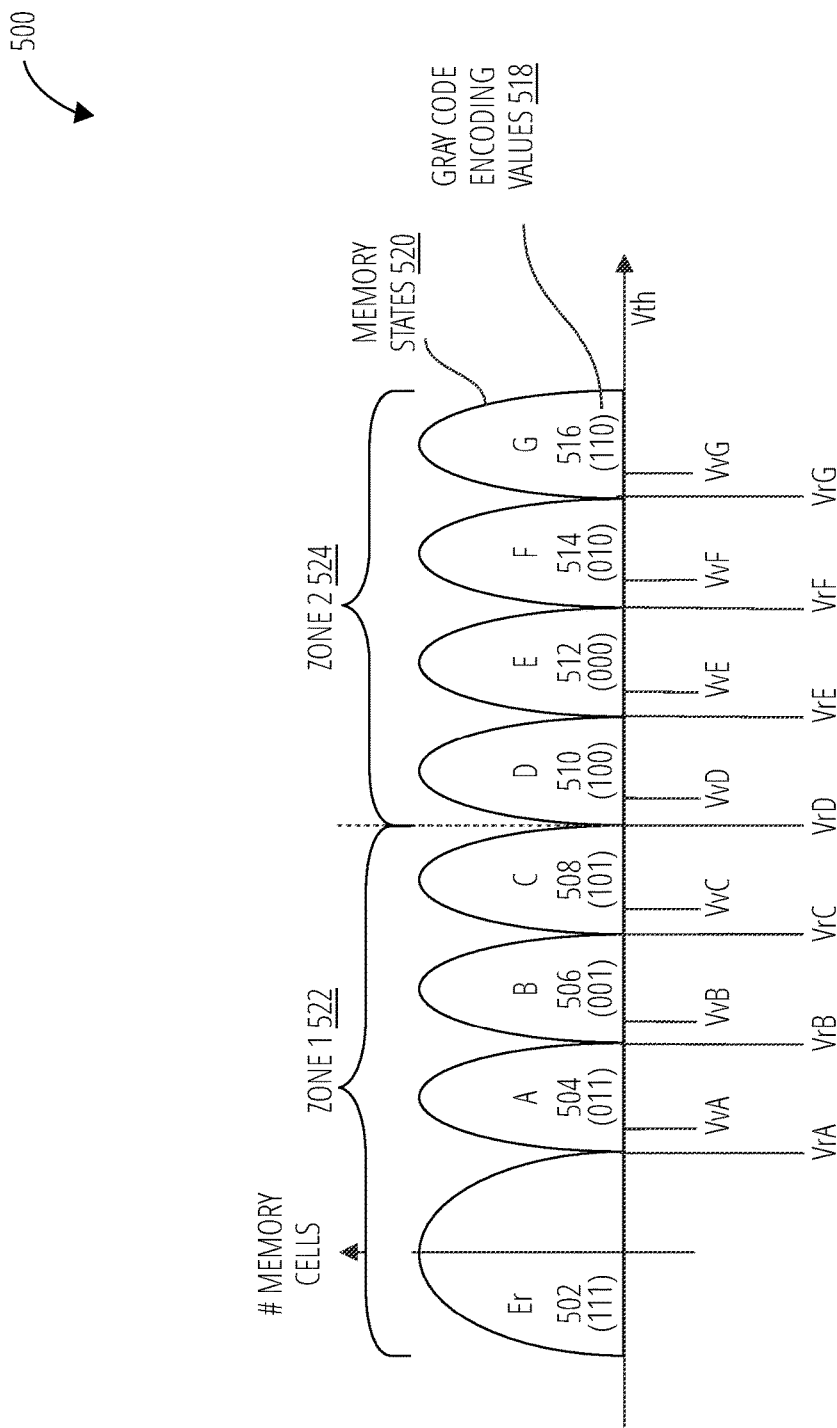
FIG. 5 illustrates threshold voltage distribution curves 500.

FIG. 5 illustrates threshold voltage distribution curves 500. The illustrated voltage distribution curves are for memory cells programmed to store three bits of data. At a given point in time, each memory cell may be in a plurality of memory state (also referred to as data states). The memory states may include an erased state and a plurality of programmed states. The number of programmed states corresponds to the number of bits the memory cells are programmed to store.

With reference to this FIG. 5, a memory cell programmed to store three bits may be in an erased state Er 502 or one of seven programmed states A 504, B 506, C 508, D 510, E 512, F 514, or G 516. Each voltage distribution curve is associated with the erased state or one of the programmed states. Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage VTH a memory cell has enables the data (i.e., the logic values of the bits) that the memory cell is storing to be determined.

The specific relationship between the data programmed into the memory cells and the threshold voltage levels of the memory cell depends on the data encoding scheme used for programming the memory cells. In one example, a Gray code scheme may be used to assign data values to the threshold voltage distribution curves. "Gray code encoding" refers to a type of encoding scheme based on a numbering system that assigns a certain bit values to a range of threshold voltages that a memory cell may have. The bit values are assigned such that the bit pattern differs between adjacent threshold voltage ranges by only one bit. Such a bit pattern assignment is advantageous because while a threshold voltage may change, drift, from one range to a neighboring range, unintended change or drift is likely not enough to cause a two bit change in the encoding. In this manner, undesired drift can be detected and accommodated.

In one example, the range of threshold voltages may be one of a plurality of threshold voltage ranges that may be used to encode multiple bits of data into a memory cell. For example, suppose a memory cell is configured to store two bits of information, and the successive ranges of threshold voltages are between a negative lower bound threshold voltage and positive upper bound threshold, e.g., about 5 volts. If four ranges are defined the lower most range may have a bit assignment of '00', the next highest a bit assignment of '01', the next highest a bit assignment of '10', and the last range a bit assignment of '10', Of course memory cells, that store multiple bits of data may use a gray code encoding or another encoding process, such as those described in US patents: U.S. Pat. No. 6,222, 762 and/or U.S. Pat. No. 7,237,074 which are included herein by reference, for all purposes.

Under a gray code encoding scheme, for memory cells programmed with two bits of data, the data value "11" is assigned to the range of threshold voltages associated with the erased state Er 502, the data value "01" is assigned to the range of threshold voltages associated with programmed state A 504, the data value "00" is assigned to the range of threshold voltages associated with programmed state B 506, and the data value "10" is assigned to the range of threshold voltages associated with the pro-grammed state C 508. Similar relationships between data values and memory states can be made for memory cells programmed to store three bits, four bits, or other bits of data. Gray code encoding values 518 may be as illustrated for the set of memory states 520 in this embodiment.

"Set of memory states" refers to two or more memory state that a memory cell may have when the memory cell is programmed and/or erased. In certain embodiments, the number of memory states in the set of memory states depends on the number of data bits that can be represented by each memory cell. For example, a memory cell (SLC) that stores one bit may have two memory states. A memory cell (MLC) that stores two bits may have four memory states. A memory cell (TLC) that stores three bits may have eight memory states. A memory cell (QLC) that stores four bits may have sixteen memory states. A memory cell that stores five bits may have thirty-two memory states.

Prior to programming memory cells, the memory cells in the programming operation may be in the erased state Er 502. Each programmed state is associated with a respective verify voltage level Vv (e.g., VvA, VvB, etc., as illustrated). A given target memory cell is programmed in its assigned memory state when its threshold voltage VTH is above the verify voltage Vv asso-ciated with the memory state assigned to that target memory cell.

During a read operation to read data stored in target memory cells of a page, a sense circuit (e.g., sense blocks of the read/write circuits 214) may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage VTH of the target memory cells. For some configurations, the level of the voltage supplied to the selected word lines may vary depending on the states of the memory cells.

The driver circuit may bias bit lines so that a sufficient voltage is applied to the drain side of the bit lines and the cell source voltage Vcelsrc is applied to the source side of the bit lines to allow for the current flow, provided that the threshold voltage VTH of the selected memory cell allows for it.

The driver circuit may supply the voltages to the selected and unselected word lines and to certain bit lines at levels in various combinations and/or in various sequences and/or over various sense operations.

FIG. 5 illustrates that memory cells programed to memory states Er, A, B, and C have lower threshold voltages than memory cells programmed to memory states D, E, F, and G. In certain embodiments, memory cells programed to memory states, such as, Er, A, B, and C may be categorized into zone 1 522. Memory cells programed to higher memory states, such as, D, E, F, and G may be categorized into zone 2 524. "Zone" refers to a set of memory cells having a particular characteristic or attribute. In one embodiment, a zone may comprise memory cells that conduct electric current in response to application of a certain voltage level (sense voltage or read voltage or reference voltage) applied to gates of the memory cells. In another embodiment, a zone may comprise memory cells that do not conduct electric current in response to application of a certain voltage level (sense voltage or read voltage or reference voltage) applied to gates of the memory cells.

Memory cells of a word line programmed to the higher threshold voltage memory state (e.g., D, E, F, and G) tend to cause more program disturb to memory cells of a word line (e.g., WLn–1 of FIG. 4) that was programmed just before a selected word line (e.g., WLn of FIG. 4) currently being programmed. This program disturb is particularly problematic for memory cells of a word line, such as WLn–1 of FIG. 4, that have a low threshold voltage (e.g., Er, A, B, and C). A conventional adjacent word line read operation 600, described in relation to FIG. 6 may leverage this difference in program disturb.

Figure 6:
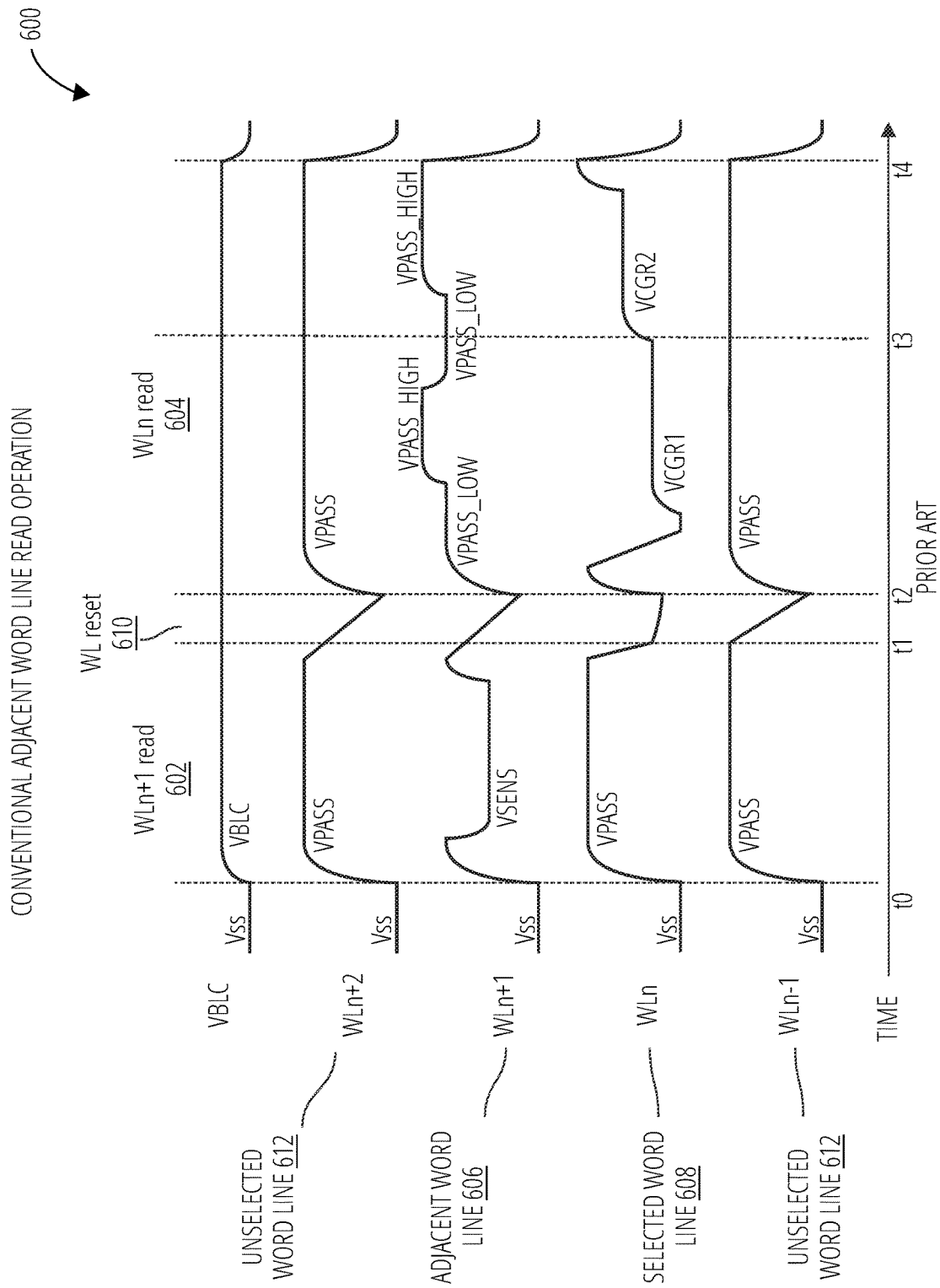
FIG. 6 illustrates a conventional adjacent word line read operation 600.

FIG. 6 illustrates a conventional adjacent word line read operation 600 in accordance with one embodiment. A conventional adjacent word line read operation 600 comprises two distinct sense/read phases (first phase 602, second phase 604) in order to accurately read memory cells of a selected word line.

In a first phase 602, memory cells of an adjacent word line 606 are read or sensed, in order to determine what program disturb the memory cells on a selected word line 608 may have experienced when the adjacent word line 606 was programmed. This first phase 602 is characterized as a look ahead read because a sense, or read operation, is performed on the adjacent word line 606 before a read storage operation on the selected word line 608.

During the first phase 602 (~t0-~t1), the memory cells on adjacent word line 606 WLn+1 are identified as being in zone 1 or zone 2. The grouping of memory cells into zones is accomplished by driving the voltage on WLn+1 to approx. pass voltage VPASS, then reducing the voltage on WLn+1 to a sense voltage VSENS and sensing the discharge current from the bit lines. More conductive bit lines indicate a memory cell at a lower memory state (e.g., Er, A, B, and C), as described with regard to FIG. 5. Less conductive bit lines indicate a higher memory state (e.g., D, E, F, and G).

In certain versions of the conventional adjacent word line read operation 600, the first phase 602 includes a categorization of the memory cells of the adjacent word line (e.g., WLn+1, in FIG. 4) into one of two zones. In order to do this categorization, the conventional adjacent word line read operation 600 may not read data values for each memory cell of the adjacent word line, but instead determine, by way of a sense operation, which memory cells are in lower VTH memory states (e.g., Er, A, B, C) and which memory cells are in higher VTH memory states (e.g., D, E, F, G). This may be done, in one version of the conventional adjacent word line read operation 600, by doing a single sense operation at a D memory state reference voltage (VrD). With the sense operation at the VrD level, memory cells that conduct may be categorized as zone 1 522, and memory cells that are nonconducting memory cells may be categorized as zone 2 524.

Between the first phase 602 and second phase 604 (~t1-~t2), the conventional adjacent word line read operation 600 resets the word lines of the memory array in preparation for the second phase 604. This is illustrated by the WL reset 610 period between t1 and t2. Of note, in order to complete the first phase 602, the voltage of the selected word line (the one that is to be read) is raised to a pass voltage VPASS. Note that during the WL reset 610, this voltage is discharged to approximately zero, or ground. Similarly, during the WL reset 610, the other word lines, unselected word lines 612 and adjacent word line 606 are also discharged to approximately zero, or ground. This discharging of the word line is referred to as cleaning up, or clearing out the channel, since it returns charge levels in the channels (the NAND strings) to a level suitable for conducting a read operation. It is desirable that charge distribution along the channels remain relatively even and stable to mitigate potential for disturbs. Consequently, the voltage levels of the selected word line 608, adjacent word line 606, and unselected word lines 612 may discharge at about the same time. The WL reset 610 (aka channel discharge, clean up) takes time. After WL reset 610, the second phase 604 is initiated.

In the second phase 604 (~t2-~t4), information about the memory states of memory cells on the adjacent word line 606 is used to perform a read on the selected word line 608 that includes an adjustment to compensate for, or negate effects of, a program disturb that the memory cells on the selected word line 608 may have experienced.

During the second phase 604, in order to determine the memory state multiple reads/sense operations may be needed, depending on who many bits are encoded in a cell and the encoding system used. In the example illustrated, two sense operations are shown at two different read voltages, VCGR1 (~t2-~t3) and VCGR2 (~t3-~t4).

Also during the second phase 604, the voltage of each word line (adjacent word line 606, 604, and unselected word lines 612 is ramped up to a higher VTH so that the channel charge distribution remains even. Note that the selected word line 608 VTH signal includes a spike pulse just after t2, that then gradually discharges to VCGR1 in order to keep an even channel charge distribution.

"Spike pulse" refers to a voltage level provided to a structure/line/signal of a memory array at a magnitude and a for a duration such that the voltage level initially overshoots or undershoots a target voltage level for the structure/line/signal. In certain embodiments, the duration is very short, e.g., a new nanoseconds. In certain embodiments, a spike pulse may be used to raise/drive/ramp up a voltage level to a higher magnitude than a target voltage level for the duration of the spike pulse in which case the spike pulse may be referred to as a "kick". In other embodiments, a spike pulse may be used to lower/discharge/ramp down a voltage level to a lower magnitude than a target voltage level for the duration of the spike pulse in which case the spike pulse may be referred to as a "negative kick".

The structure/line/signal of the memory array receiving the spike pulse may include, but is not limited to, a selected word line, an adjacent word line, a set of unselected word lines, a source line, a source line select gate, a drain select gate, a NAND string, and the like.

In certain embodiments, one purpose of a spike pulse may be to couple up, or couple down, voltage signals in other structures of a memory array, such as neighboring structures such as word lines or bit lines. In other embodiments, one purpose of a spike pulse may be to compensate for inherent delays or disturb signals that may exist due to the design and/or architecture of the memory array. For example, in one embodiment a spike pulse may be applied to a word line to account for natural propagation delays may exist in the word line (e.g., where a driver circuit supplies a voltage at a near end of the word line).

In another embodiment, one purpose of a spike pulse may be to facilitate management of a bias level (charge level) for each channel or NAND string coupled to one or more word lines. For example as part of a read operation, unselected word lines may ramp up to a higher voltage level than a selected word line or an adjacent word line. In order to maintain an even distribution of charge along the channel(s) (NAND strings), a spike pulse may be applied to the selected word line or adjacent word line for the read operation. In this manner the charge in the channel, NAND strings experience an even bias level across the memory array.

After the voltage on adjacent word line 606 reaches a pass voltage, the pass voltage, VPASS_LOW, is maintained while memory cells in zone 1 522 are read. Then, the voltage is increased to VPASS_HIGH for reading of memory cells in zone 2 524. The voltage on adjacent word line 606 then discharges to VPASS_LOW and increases again to VPASS_HIGH for the reading at the VCGR2.

While the VPASS_LOW and VPASS_HIGH voltages are applied to adjacent word line 606, two different read voltages, VCGR1 and VCGR2 are applied to selected word line 608 to read the data on memory cells of selected word line 608. While the two different read voltages, VCGR1 and VCGR2 are applied sense blocks connected to the bit lines detect whether or not the memory cells conduct.

Finally, the voltage on selected word line 608 is raised to the pass voltage, VPASS, so that all the word lines discharge together after the second phase 604. Unselected word line 612 (WLn−1 and WLn+2) may have VPASS applied during both the first phase 602 and the second phase 604. As illustrated the voltage on the bit line (VBLC) of each memory cell in the memory array is raised at t0 and remains at the same level for both the first phase 602 and the second phase 604 and discharges at t4. The bit line voltage is raised so that current will flow through memory cells of the selected word line 608 that conduct when read voltages are applied to the selected word line 608.

Conventional adjacent word line read operation 600 comes with a read time penalty. First, the a WL reset 610 between the first phase 602 and second phase 604 takes time. Consequently, the conventional adjacent word line read operation 600 may take approximately 2.7 times as long as a normal read.

FIG. 7 illustrates a memory array with die controller 700 in accordance with one embodiment. The memory array with die controller 700 may comprise memory cells 702 arranged along NAND strings the connect to bit lines, such as the mth bit line 704 (BLm) illustrated, within memory array. The memory array with die controller 700 may further comprise a die controller 706, which may include a driver circuit 708 and a sense circuit 710 including a number of sense amps 712.

The driver circuit 708 may be coupled to the word lines 714 and bit lines 716 to drive a sense voltage and pass voltage to the word lines 714 and a bit line voltage and bit line compensation voltage to the bit lines 716. (switches between the driver circuit 708 and the word lines 714 and bit lines 716 may exist but are not shown for clarity of this description) The sense amps 712 of the sense circuit 710 may be coupled to the bit lines 716 in sequential order to sense attributes of the memory cells 702 along the bit lines 716.

FIG. 7 includes an example NAND string 718. Each memory cell 702 of the NAND string 718 is coupled to a word line (e.g., word lines 714) and each NAND string is coupled to a bit line (e.g., bit lines 716). In one embodiment, memory cell 720 is a memory cell of the adjacent word line WLn+1 that is adjacent along the NAND string to memory cell 722 of the selected word line WLn.

The driver circuit 708 may be configured to supply a sense voltage to an adjacent word line, such as WLn+1 and a pass voltage to a selected word line such as WLn and to unselected word lines WLn−1 and WLn+2, etc. "Driver circuit" refers to any circuit, sub-circuit, electronic component, hardware, software, firmware, module, logic, device, or apparatus configured, programmed, designed, arranged, or engineered to supply a voltage, either in analog or digital wave form, to another circuit, sub-circuit, electronic component, logic, device, or apparatus.

In certain embodiments, a driver circuit supplies, or drives, a single voltage to another circuit at a predefined magnitude and for a predefined duration, or at an initial magnitude that ramps up (or charge) to the predefined magnitude. In certain embodiments, a driver circuit supplies or drives a single voltage to another circuit at a predefined magnitude and then ramps down (or discharge) from the predefined magnitude to a target magnitude.

In another embodiment, a driver circuit supplies a plurality of different voltages to a plurality of circuits. Certain of the plurality of different voltages may be analog voltages and certain of the plurality of different voltages may ramp up to one or more target voltages and certain of the plurality of different voltages may ramp down to one or more target voltages.

In certain embodiments, a single driver circuit may supply one or more different voltages to a plurality of circuits, gates, control lines, and/or switches. In another embodiment, a plurality of driver circuits may each individually supply one or more different voltages to one or more of a plurality of circuits, gates, control lines, and/or switches. The plurality of driver circuits may collectively operate and provide the functions of a driver circuit disclosed and/or claimed herein.

"Sense voltage" refers to a voltage level configured to activate (cause to conduct) memory cells having a threshold voltage equal to or less than the sense voltage. In certain embodiments, a sense voltage may be used to read or sense a memory state for memory cells having a threshold voltage at or below the sense voltage. In other embodiments, a sense voltage is not used to read a memory state for memory cells having a threshold voltage at or below the sense voltage, but is used to determine which memory cells along a word line have a threshold voltage at or below the sense voltage.

The driver circuit 708 may be further configured to supply a bit line voltage to bit lines 716 of the memory array with die controller 700, such as the illustrated BLm. "Bit line voltage" refers to a voltage level supplied to, or built up within a bit line. In certain embodiments, a bit line connects to a sense amplifier by way of a switch (e.g., a transistor) that controls whether bias/charge on the bit line is provided to a channel or NAND string of a memory array. In certain embodiments, a bit line voltage may be referred to by the abbreviation VBLC.

The sense circuit 710 may be configured to determine a set of nonconducting memory cells and a set of conducting memory cells on the adjacent word line WLn+1 based on a sense voltage applied to the adjacent word line WLn+1 and which bit lines indicate that the memory cells conduct at the sense voltage. The sense amps 712 detect which bit lines conduct sufficient current for a sense time and which do not.

"Sense circuit" refers to any circuit, sub-circuit, electronic component, hardware, software, firmware, module, logic, device, or apparatus configured, programmed, designed, arranged, or engineered to determine a memory state for a memory cell coupled to the sense circuit. A sense circuit may be referred to as a sense amplifier or sense amp herein and may or may not include one or more sense amplifiers.

In one embodiment, a sense circuit determines whether a memory cell coupled to the sense circuit conducts a current in response to certain bias voltages applied to a selected word line, to unselected word lines, one or more bit lines, and to a bit line coupled to the sense circuit. Given a certain reference voltage applied to a selected word line, the sense circuit determines whether a memory cell coupled to the selected word line conducts at the reference voltage. This determination is referred to herein as a sense operation. If the memory cell does conduct, this helps to determine the memory state of the memory cell. In certain embodiments, a plurality of reference voltages and a plurality of sense/read operations is performed to determine a memory state for a memory cell. Sense operations may be performed during a read storage operation and during a program storage operation to confirm/verify that a memory state of a memory cell has reached a target memory state.

"Conducting memory cells" refers to memory cells that conduct an electric current during a sense operation or a reading operation applied to the memory cells. In certain embodiments, such as flash memory, a sense operation or read operation may apply a certain voltage level, referred to as a reference voltage, to a selected word line of memory cells. Memory cells along the selected word line that conduct electric current may be detected by one or more sense circuits (aka sense amps) connected to bit lines that are connected to the memory cells of the selected word line.

In certain embodiments, once a set of conducting memory cells are identified, a set of nonconducting memory cells is readily determinable as every memory cell on the selected word line that did not conduct when the reference voltage was applied to the selected word line. For example, in one embodiment, given a set of all the memory cells of a selected word line, the set of nonconducting memory cells may comprise a set complement function applied to the set of conducting memory cells.

Those of skill in the art will recognize that the sense circuit, sense amp, may detect either which memory cells conduct electric current or which memory cells do not conduct electric current depending on how the sense circuit is configured. Furthermore, those of skill in the art will appreciate how to modify a sense circuit that determines conducting memory cells into a sense circuit that determines nonconducting memory cells.

In certain embodiments, a sense circuit determines a set of conducting memory cells based on a reference voltage applied to a selected word line. In one embodiment, the reference voltage is a read voltage applied over one or more steps to determine a data value stored by the memory cells. In another embodiment, the reference voltage is a sense voltage applied once to determine which memory cells conduct at the sense voltage rather than a data value stored by the memory cells.

"Nonconducting memory cells" refers to Memory cells that do not conduct an electric current during a sense operation or a reading operation applied to the memory cells. In certain embodiments, such as flash memory, a sense operation or read operation may apply a certain voltage level, referred to as a reference voltage, to a selected word line of memory cells. Memory cells along the selected word line that do not conduct electric current may be detected by one or more sense circuits (aka sense amps) connected to bit lines that are connected to the memory cells of the selected word line. In certain embodiments, when determining conducting memory cells, or when determining nonconducting memory cells, the selected word line may comprise any word line of a memory array.

In certain embodiments, once a set of nonconducting memory cells are identified, a set of conducting memory cells is readily determinable to comprise every memory cell on the selected word line that did conduct when the reference voltage was applied to the selected word line. For example, in one embodiment, given a set of all the memory cells of a selected word line, the set of conducting memory cells may comprise a set complement function applied to the set of nonconducting memory cells.

Those of skill in the art will recognize that the sense circuit, sense amp, may detect either which memory cells conduct electric current or which memory cells do not conduct electric current depending on how the sense circuit is configured. Furthermore, those of skill in the art will appreciate how to modify a sense circuit that determines nonconducting memory cells into a sense circuit that determines conducting memory cells.

In certain embodiments, a sense circuit determines a set of nonconducting memory cells based on a reference voltage applied to a selected word line. In one embodiment, the reference voltage is a read voltage applied over one or more steps to determine a data value stored by the memory cells. In another embodiment, the reference voltage is a sense voltage applied once to determine which memory cells do not conduct at the sense voltage rather than a data value stored by the memory cells.

The die controller 706 may be configured to direct the driver circuit 708 to ramp the sense voltage on the adjacent word line up to the same level as the pass voltage. The driver circuit 708 may also be directed to ramp the pass voltage on the selected word line to ground.

Finally, the driver circuit 708 may be directed to ramp the bit line voltage for bit lines 716 coupled to the set of nonconducting memory cells to a bit line compensation voltage. The die controller 706 may be configured to direct the sense circuit 710 to read memory cell 702 of the selected word line, WLn, based on the bit line compensation voltage.

"Bit line compensation voltage" refers to a voltage supplied to a bit line, the voltage is supplied for a predefined duration and at a predefined magnitude to compensate for an adverse influence affecting operations during a storage operation. For example, in one embodiment the adverse influence comprises a program disturb that affects the selected word line when the adjacent word line is programmed.

Figure 8:
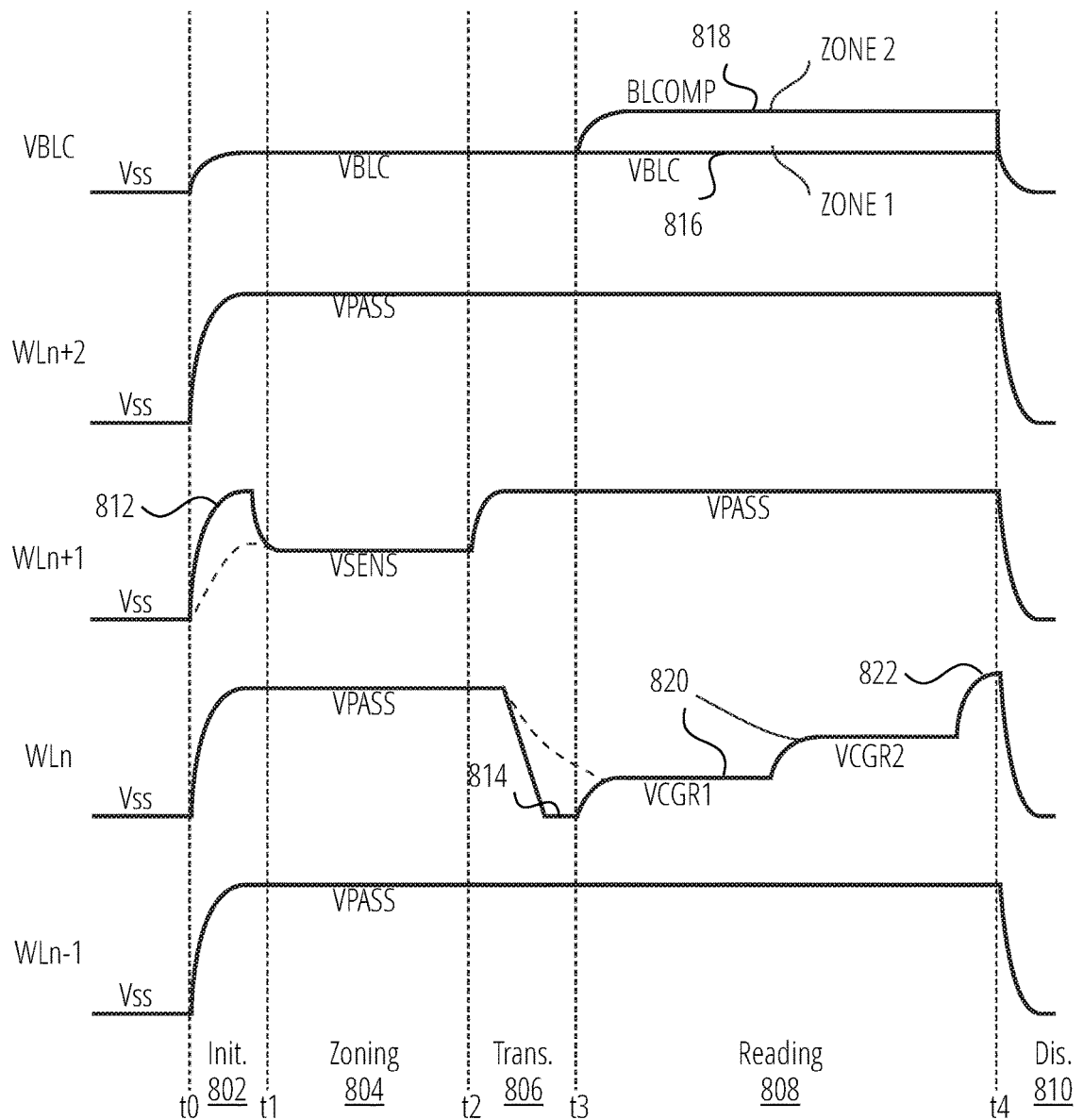
FIG. 8 illustrates an integrated adjacent word line read operation 800 in accordance with one embodiment.

FIG. 8 illustrates an integrated adjacent word line read operation 800 in accordance with one embodiment. "Integrated adjacent word line read operation" refers to a read operation that dynamically and automatically adjusts one or more read/sense operations for memory cells of a selected word line based on at least a characterization of a magnitude of a threshold voltage of memory cells on an adjacent word line. In certain embodiments, the integrated adjacent word line read operation eliminates certain steps or phases of a conventional "adjacent word line" read operation. For example, the integrated adjacent word line read operation may not include a channel clean up step and/or a reset of biases on the adjacent word line, the selected word line, and/or unselected word lines (e.g., WL reset). Furthermore, the integrated adjacent word line read operation may eliminate a spike pulse on the selected word line between when the adjacent word line is sensed and when the selected word line is read, because the biases on the word line may already be at a satisfactory level.

The integrated adjacent word line read operation 800 may take 1 to 1.5 times the normal read time. The integrated adjacent word line read operation 800 replaces the first phase 602 and second phase 604 and the intermediate WL reset 610 with a more integrated operation. The integrated adjacent word line read operation 800 may include a series of phases, but does not include the WL reset 610 step.

The wave forms illustrate an integrated adjacent word line read operation 800, which may involve an initialization phase 802, a zoning phase 804, a transition phase 806, a reading phase 808, and a discharge phase 810. The initialization phase 802 may extend from t0 to t1. The zoning phase 804 may extend from t1 to t2. The transition phase 806 may extend from t2 to t3. The reading phase 808 may extend from t3 to t4. The discharge phase 810 may occur after t4, when the read is complete. The signals illustrated throughout these phases may be supplied by the driver circuit 708 and sensing of the memory cells may be done by the sense circuit 710, directed by the die controller 706.

During the initialization phase 802, the driver circuit supplies a pass voltage VPASS to a selected word line (WLn) and unselected word lines (WLn−1, WLn+1, and WLn+2) of a memory array. The driver circuit may also supply a bit line voltage VBLC to bit lines of the memory array.

In one embodiment, the driver circuit supplies a spike pulse 812 to the adjacent word line WLn+1 (i.e., a word line adjacent to the selected word line WLn). The spike pulse 812 may facilitate keeping an even charge distribution in channels (NAND strings) of the memory array. In some embodiments, there may be no spike pulse 812. WLn+1 may ramp directly to VSENS, as indicated by the dashed line below the spike pulse 812.

Next, the driver circuit supplies a sense voltage VSENS to the adjacent word line WLn+1. The driver circuit may supply the pass voltage, sense voltage, and bit line voltage concurrently. The driver circuit may in some embodiments ramp the sense voltage, the pass voltage, the bit line voltage, and/or a bit line compensation voltage concurrently.

During the zoning phase 804, the adjacent word line WLn+1 may be sensed by the sense circuit to determine a set of conducting memory cells and a set of nonconducting memory cells by applying the sense voltage VSENS. The conducting memory cells may be categorized as zone 1 and the nonconducting memory cells on WLn+1 may be categorized as zone 2.

As described above, in relation to FIG. 5, a determination of memory cells for zone 1 522 and zone 2 524 may be done using a single memory state reference (read) voltage. Similarly, in relation to embodiments of the claimed solution, a single memory state reference (read) voltage may be used. In addition, the actual memory state of the memory cells may not be determined, just whether the VTH of the memory cells are above or below the single memory state reference (read) voltage. In one embodiment, the single memory state reference (read) voltage (the sense voltage) may be such that fifty percent of the memory states are above the sense voltage and fifty percent of the memory states are below the sense voltage. In this manner, zone 2 may include memory cells of the adjacent word line that are programmed to a memory state greater than fifty-percent (midway) of a total number of memory states for memory cells of the three-dimensional memory array. Memory cells on the adjacent word line in zone 1 and zone 2, particularly zone 2 which have higher VTH inform the reading of memory cells on WLn, the selected word line.

In some embodiments, VSENS may comprise a read voltage for a memory state midway within a set of sequential memory states for the memory cells. VSENS may include the spike pulse 812 before discharging to the sense voltage.

The sense voltage may in some embodiments comprise one or more read voltages of a multi-state read process. In these embodiments, the sense circuit may be configured to read memory states for the memory cells of the adjacent word line. In such embodiments, the driver circuit or die controller may create a zone for each possible memory state. Accordingly, the driver circuit may be configured to ramp each set of the bit lines (one set corresponding to each possible memory state) to a predefined bit line voltage.

"Predefined bit line voltage" refers to a voltage level supplied to, or built up within a bit line, the voltage level is predefined such that a read operation of a selected word line will compensate for a disturb of the memory state of a memory cell on the bit line of the selected word line that occurred when an adjacent word line was programmed to a particular memory state.

In one embodiment, a separate predefined bit line voltage exists for each memory state that may be sensed/read from the selected word line. For example, if the selected word line is read by applying an A memory state read voltage to the selected word line, the bit lines corresponding to memory cells of the adjacent word line that have been programmed to an A memory state will be biased to a predefined bit line voltage for the A memory state. Similarly, bit lines for memory cells in each of the other memory state sensed on the selected word line (e.g., B, C, D, E, F, G) may be biased to a corresponding predefined bit line voltage for each of these memory states.

"Multi-state read process" refers to a read operation that uses a series of sense/read operations performed on memory cells to determine a final memory state for the memory cells. The multi-state read process may use a series of sense/read operations to determine the memory state of a memory cell because more than one bit of data/information may be encoded on the memory cell. The number of bits encoded in a memory cell and the form of the encoding used may determine the number and/or order of sense/read operations performed to determine the memory state for the cells. In certain embodiments, a multi-state read process is implemented in logic within a state machine, circuitry, or a processor coupled to a memory array of memory cells.

More explanation and examples of a multi-state read process may be found in US patents: U.S. Pat. Nos. 7,196, 928, 6,222,762, and/or 7,237,074, each of which is incorporated herein by reference, for all purposes.

After the zoning phase 804, the die controller may direct the driver circuit to ramp the sense voltage on the adjacent word line WLn+1 to the pass voltage and the pass voltage on the selected word line WLn down to ground or a read voltage.

During the transition phase 806, the VSENS, sense voltage on WLn+1 may be ramped up to a pass voltage VPASS in response to sensing WLn+1 (the adjacent word line).

Also, in response to sensing WLn+1, a pass voltage VPASS on the selected word line WLn may be discharged as shown to a discharge voltage. Note that there is no spike pulse on the selected word line WLn during the transition phase 806 because the other word lines are already at an elevated voltage and because there is no WL reset 610.

The discharge voltage 814 may be ground or VSS. Or in some embodiments, as illustrated by the dashed line, may be a first read voltage VCGR1 needed to read memory cells of the selected word line, which is described below. "Discharge voltage" refers to a voltage level that is a target voltage level for voltage on a particular structure or circuits (circuitry) carrying a signal. In certain embodiments, certain memory array structures may include a NAND string and/or a channel. In these embodiments, it may be desirable that a charge distribution within the channel be evenly distributed along the NAND string. Therefore, in such embodiments, the discharge voltage may be a voltage level that is at or about the same as the voltage levels of other structures along the NAND string, such as bit lines, unselected word lines, a selected word line, and/or a source line. In certain storage operations, one or more of the biased structures may be biased to the discharge voltage such that these structures discharge together from the discharge voltage to a lower voltage such as ground.

After the transition phase 806, the die controller may direct the driver circuit to ramp the bit line voltage of the VBLC to a bit line compensation voltage for nonconducting memory cells and concurrently maintain the bit line voltage of the VBLC to a predefined bit line voltage for conducting memory cells 816 for conducting memory cells.

During the reading phase 808, bit lines for the set of nonconducting memory cells (i.e., zone 2 bit lines) may be ramped up to the predefined bit line voltage for nonconducting memory cells 818 BLCOMP, while the conducting memory cells (i.e., memory cells of zone 1 bit lines) remain at the predefined bit line voltage for conducting memory cells 816 VBLC. BLCOMP may be 0.1 or 0.2 volts higher than VLBC during read operations.

The sense circuit then reads the memory cells of WLn using one or more read voltages of a multi-state read process 820 applied to WLn. In some embodiments, the multi-state read process 820 on WLn may be ramped to one or more read voltages, such as VCGR1 and VCGR2. WLn may be sensed for a set of conducting memory cells at each read voltage, and a memory state for these memory cells may be determined. The first read voltage, VCGR1, may be the discharge voltage 814 reached near the end of the transition phase 806, this shortens the time needed to ramp to VCGR1.

During the discharge phase 810, the bit lines, selected word line, adjacent word line, and unselected word lines, may all be discharged. In certain embodiments, the driver circuit may ramp WLn using a spike pulse 822, so that all the word lines can discharge together. In some embodiments, these signals may all ramp down to ground (VSS) as illustrated. "Discharge phase" refers to a period of time during which one or more signals are permitted to discharge voltage that is in lines or circuits (circuitry) carrying the signals.

Figure 9:
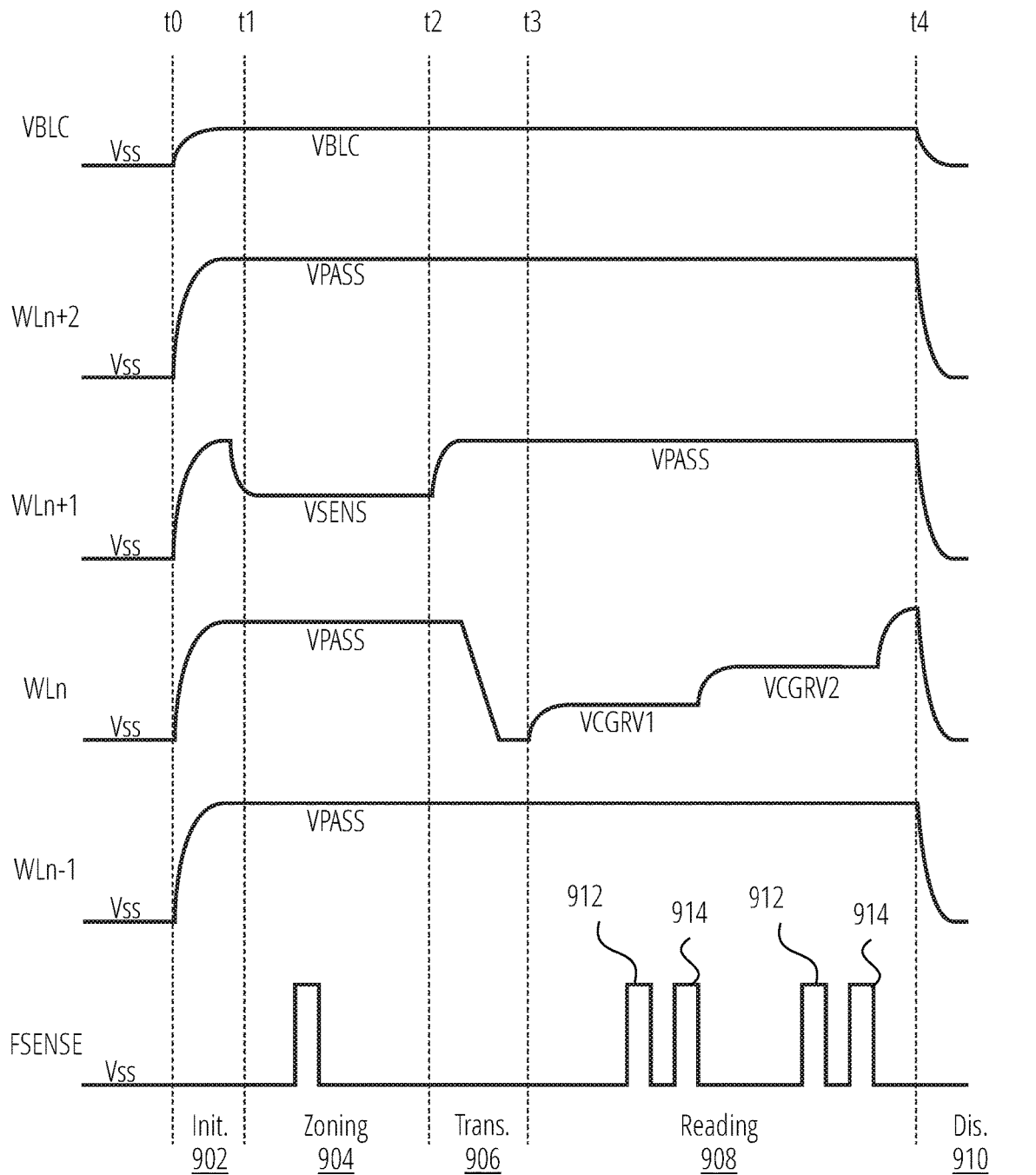
FIG. 9 illustrates an integrated adjacent word line read operation 900 in accordance with another embodiment.

FIG. 9 illustrates an integrated adjacent word line read operation 900. In this alternative embodiment, instead of concurrently applying more than one VLBC level to bit lines for memory cells of different zones as illustrated in FIG. 8, an F SENSE signal is used to perform one sense operation for bit lines connected to zone 1 912 memory cells and another sense operation for bit lines connected to zone 2 914 memory cells. Otherwise, many of the signaling levels driven onto the word lines and bit lines are similar to those illustrated in FIG. 8.

The integrated adjacent word line read operation 900 may be performed by a system comprising a three-dimensional memory array comprising bit lines and word lines. The word lines may comprise a selected word line (WLn), an adjacent word line (WLn+1), and unselected word lines (WLn−1 and WLn+2). The operation may be performed in several phases as illustrated: the initialization phase 902 may span t0 to t1, the zoning phase 904 may span t1 to t2, the transition phase 906 may span t2 to t3, the reading phase 908 may span t3 to t4, and the discharge phase 910 may occur after t4.

A die controller may be configured to operate a driver circuit and a sense circuit to implement this integrated adjacent word line read operation 900. The driver circuit may be coupled to the word lines and bit lines as illustrated in FIG. 7. The driver circuit may be configured to supply different voltage biases to the word lines and bit lines. A sense circuit may be coupled to the bit lines and configured to sense conducting memory cells and nonconducting memory cells of the word lines of the three-dimensional memory array.

During the initialization phase 902, the die controller may direct the driver circuit to bias the bit lines to VBLC and the word lines to VPASS. During the zoning phase 904, the adjacent word line WLn+1 may be ramped to VSENS, and a sensing pulse may be generated on the FSENSE line. As a result, the sense circuit may be configured to sense conducting and nonconducting memory cells. The conducting memory cells may be organized into a first zone and the nonconducting memory cells may be organized into a second zone, similar to the previous embodiment.

During the transition phase 906, the driver circuit may be directed by the die controller to ramp the adjacent word line WLn+1 back to VPASS, and to discharge the selected word line WLn to a lower discharge voltage, which may be VSS, or may be the first read voltage VCGR1, as previously described.

At the beginning of the reading phase 908, the driver circuit may bias the selected word line WLn to the first read voltage VCGR1, provided this has not already been accomplished during the transition phase 906. Two pulses may be driven on the FSENSE line, directing the sense circuit to sense memory cells of the first zone and memory cells of the second zone while the driver circuit biases the selected word line to VCGR1. To compensate for the higher memory state of memory cells on WLn+1 disturbing the VTH of memory cells on WLn, the duration of the FSENSE pulse, zone 1 912, for zone 1 may be shorter than the duration of the F SENSE pulse, zone 2 914, for zone 2.

Next, the driver circuit may be directed by the die controller to bias the selected word line to a second read voltage VCGR2. In some embodiments, the driver circuit may bias WLn to VCGR1 and then to VCGR2 based on a gray code encoding of memory states stored in the memory cells of WLn. Gray code encoding may, for example, be assigned as illustrated in FIG. 5.

The sense circuit may then be directed to sense the memory cells of the first and second zone by two more pulses on FSENSE. As a result, a memory state may be determined for the memory cells of the selected word line WLn based on sensed memory cells of the first and second zones. The sense circuit may thus sense memory cells of the second zone in sequence after sensing memory cells of the first zone.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Having thus described illustrative embodiments in detail, it will be apparent that modifications and variations are possible without departing from the scope of the invention as claimed.

What is claimed is:

1. An apparatus comprising:
a control circuit configured to initiate sensing to identify a set of nonconducting memory cells and a set of conducting memory cells on an adjacent word line that is adjacent to a selected word line based on a sense voltage that corresponds to a memory state substantially midway within a set of memory states for memory cells of the adjacent word line, the adjacent word line and the selected word line located in a NAND memory array, initiate supply of a bit line voltage to bit lines of the set of conducting memory cells and concurrent supply of a bit line compensation voltage to bit lines of the set of nonconducting memory cells;
wherein the control circuit is configured to cause reading of memory cells of the selected word line concurrent with supplying the bit line voltage and the bit line compensation voltage.

2. The apparatus of claim 1, wherein the control circuit is configured to cause the sense voltage, a pass voltage for unselected word lines, and the bit line voltages to be supplied concurrently.

3. The apparatus of claim 1, wherein the control circuit is configured to cause the sense voltage, a pass voltage for unselected word lines, and the bit line voltage for the bit lines coupled to the set of nonconducting memory cells to be ramped to the bit line compensation voltage concurrently.

4. The apparatus of claim 1, wherein the control circuit is configured to cause reading of the memory cells of the selected word line by causing:
ramping a voltage on the selected word line up to two or more read voltages;
sensing the selected word line for a set of conducting memory cells at each of the two or more read voltages; and
determining memory states for memory cells of the selected word line from the sensing.

5. The apparatus of claim 1, wherein a voltage supplied to the adjacent word line includes a spike pulse that discharges to the sense voltage.

6. The apparatus of claim 1, wherein the apparatus is coupled to a three-dimensional memory array that comprises the selected word line and unselected word lines, the selected word line and the unselected word lines are organized in a sequence, and the control circuit is configured to program each word line of the three-dimensional memory array in a sequential order such that the adjacent word line is programmed after the selected word line.

7. The apparatus of claim 1, wherein the control circuit is configured to ramp the sense voltage, a pass voltage for unselected word lines, and the bit line voltage subsequent to sensing the set of nonconducting memory cells and the set of conducting memory cells.

8. The apparatus of claim 1, wherein the sense voltage comprises a plurality of read voltages of a multi-state read process and the control circuit is configured to ramp a plurality of sets of bit lines of the memory array to a predefined bit line voltage, each set of the plurality of sets of bit lines associated with a corresponding read memory state of a plurality of read memory states and a corresponding read voltage of the plurality of read voltages.

9. A system comprising:
a three-dimensional memory array comprising bit lines and word lines, the word lines comprising a selected word line, an adjacent word line, and unselected word lines;
a driver circuit coupled to the word lines and the bit lines, the driver circuit configured to supply different voltage biases to the word lines and the bit lines; and
a sense circuit coupled to the bit lines and a die controller coupled to the driver circuit, the sense circuit configured to sense conducting memory cells and nonconducting memory cells of the word lines of the three-dimensional memory array;
wherein the die controller is configured to:
direct the driver circuit to bias the bit lines and the word lines;
direct the sense circuit to sense the conducting memory cells and the nonconducting memory cells of the adjacent word line;
organize the conducting memory cells into a first zone and the nonconducting memory cells into a second zone;
direct the driver circuit to bias the selected word line to a first read voltage;
direct the sense circuit to sense memory cells of the first zone and memory cells of the second zone while the driver circuit biases the selected word line to the first read voltage;
direct the driver circuit to bias the selected word line to a second read voltage;
direct the sense circuit to sense the memory cells of the first zone and the memory cells of the second zone while the driver circuit biases the selected word line to the second read voltage; and
determine a memory state for the memory cells of the selected word line based on sensed memory cells of the first zone and sensed memory cells of the second zone.

10. The system of claim 9, further comprising NAND strings of memory cell, each memory cell coupled to a word line and each NAND string coupled to a bit line and wherein the second zone comprises memory cells of the adjacent word line that are adjacent along the NAND string to memory cells of the selected word line and wherein memory cells of the adjacent word line are programmed to a memory state greater than fifty-percent of a total number of memory states for memory cells of the three-dimensional memory array.

11. The system of claim 9, wherein the driver circuit biases the selected word line to the first read voltage and to a second read voltage in accordance with a gray code encoding of memory states stored in memory cells of the selected word line.

12. The system of claim 9, wherein the sense circuit senses the memory cells of the second zone in sequence after sensing the memory cells of the first zone.

13. The system of claim 9, wherein the die controller is configured to operate the driver circuit and sense circuit to implement an integrated adjacent word line read operation.

14. A method for reading memory cells comprising:
during an initialization phase, supplying a pass voltage to unselected word lines and to a selected word line of a memory array;
during the initialization phase, supplying a bit line voltage to bit lines of the memory array;
during the initialization phase, supplying a sense voltage to an adjacent word line of the memory array;
during a zoning phase, sensing the adjacent word line for a set of nonconducting memory cells of the adjacent word line in response to supplying the sense voltage;
during a transition phase, ramping the sense voltage on the adjacent word line up to the pass voltage, in response to sensing the adjacent word line;
during the transition phase, discharging the pass voltage on the selected word line, in response to sensing the adjacent word line;
during a reading phase, ramping the bit line voltage for bit lines coupled to the set of nonconducting memory cells to a bit line compensation voltage; and
during the reading phase, reading memory cells of the selected word line at one or more read voltages.

15. The method of claim 14, further comprising:
during the reading phase, ramping the read voltage on the selected word line to a discharge voltage;
during a discharge phase, discharging the bit lines, the unselected word lines, the adjacent word line, and the selected word line.

16. The method of claim 14, wherein reading memory cells of the selected word line comprises:
ramping the read voltage on the selected word line up to one or more read voltages;
sensing the selected word line for a set of conducting memory cells at each read voltage; and
determining a memory state for memory cells of the selected word line.

17. The method of claim 14, wherein the sense voltage comprises a read voltage for a memory state midway within a set of sequential memory states for the memory cells.

18. The method of claim 14, wherein the sense voltage supplied to the adjacent word line comprises a spike pulse that discharges to the sense voltage.

19. The method of claim 14, wherein discharging the pass voltage on the selected word line comprises discharging the pass voltage on the selected word line to a first read voltage.

20. The method of claim 14, wherein discharging the pass voltage on the selected word line comprises discharging the pass voltage on the selected word line to ground.

\* \* \* \* \*